(12) United States Patent
Watanabe et al.

(10) Patent No.: US 11,233,303 B2
(45) Date of Patent: Jan. 25, 2022

(54) HIGH FREQUENCY FILTER

(71) Applicant: MITSUBISHI ELECTRIC CORPORATION, Tokyo (JP)

(72) Inventors: Motomi Watanabe, Tokyo (JP); Takeshi Yuasa, Tokyo (JP); Takuma Nishimura, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/637,593

(22) PCT Filed: Sep. 14, 2018

(86) PCT No.: PCT/JP2018/034216
§ 371 (c)(1),
(2) Date: Feb. 7, 2020

(87) PCT Pub. No.: WO2019/065313
PCT Pub. Date: Apr. 4, 2019

(65) Prior Publication Data
US 2020/0259234 A1   Aug. 13, 2020

(30) Foreign Application Priority Data

Sep. 29, 2017  (WO) .................. PCT/JP2017/035552

(51) Int. Cl.
*H03H 7/38*   (2006.01)
*H01P 1/202*  (2006.01)
(Continued)

(52) U.S. Cl.
CPC .............. *H01P 1/202* (2013.01); *H01P 1/203* (2013.01); *H03H 7/38* (2013.01); *H05K 1/0251* (2013.01)

(58) Field of Classification Search
CPC .......... H03H 7/38; H05K 1/115; H05K 1/116; H05K 1/0251; H05K 1/025; H05K 1/0222; H05K 1/0221; H01P 5/08; H01P 5/02
(Continued)

(56) References Cited

U.S. PATENT DOCUMENTS

| 5,525,942 A    | 6/1996 | Horii et al. |
| 7,492,146 B2 * | 2/2009 | Behziz ................. H05K 1/0251 324/756.06 |

(Continued)

FOREIGN PATENT DOCUMENTS

| JP | 7-58506 A     | 3/1995  |
| JP | 2006-311306 A | 11/2006 |
| JP | 2015-185862 A | 10/2015 |

OTHER PUBLICATIONS

Extended European Search Report of Application No. EP 18861055.4 dated Sep. 29, 2020.
(Continued)

*Primary Examiner* — Stephen E. Jones
(74) *Attorney, Agent, or Firm* — Birch, Stewart, Kolasch & Birch, LLP

(57) ABSTRACT

A coaxial line is provided which includes: a first columnar conductor disposed inside a multilayer substrate such that one end thereof is coupled to a first stripline and that the other end thereof is coupled to a second stripline; and one or more second columnar conductors penetrating the multilayer substrate such that one end thereof is coupled to a ground layer and that the other end thereof is coupled to a ground layer, the first columnar conductor acting as an inner conductor, and the second columnar conductors acting as outer conductors. Each of the first and second striplines is
(Continued)

coupled to an open stub acting as resonators and a matching conductor acting as capacitance matching elements.

4 Claims, 21 Drawing Sheets

(51) Int. Cl.
*H01P 1/203* (2006.01)
*H05K 1/02* (2006.01)

(58) Field of Classification Search
USPC .......................................... 333/33, 238, 246
See application file for complete search history.

(56) References Cited

U.S. PATENT DOCUMENTS

| 2006/0255886 | A1 |  | 11/2006 | Ninomiya et al. |  |
|---|---|---|---|---|---|
| 2007/0205847 | A1 | * | 9/2007 | Kushta | H05K 1/0222 333/33 |
| 2008/0093112 | A1 |  | 4/2008 | Kushta |  |
| 2015/0180107 | A1 | * | 6/2015 | Ao | H01P 3/085 333/12 |

OTHER PUBLICATIONS

Hong, "Microstrip Filters for RF/Microwave Applications", 2011, p. 172 and p. 184, Total 4 pages.

\* cited by examiner

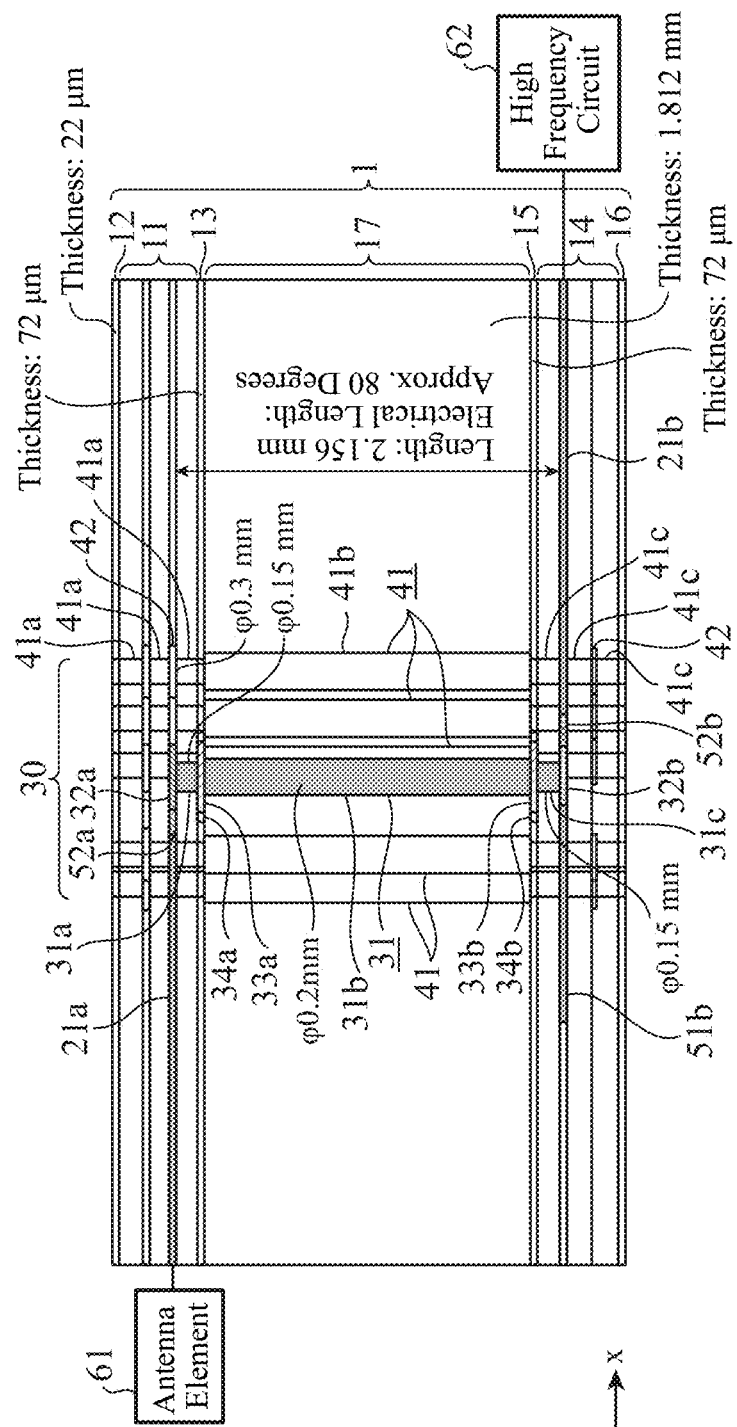
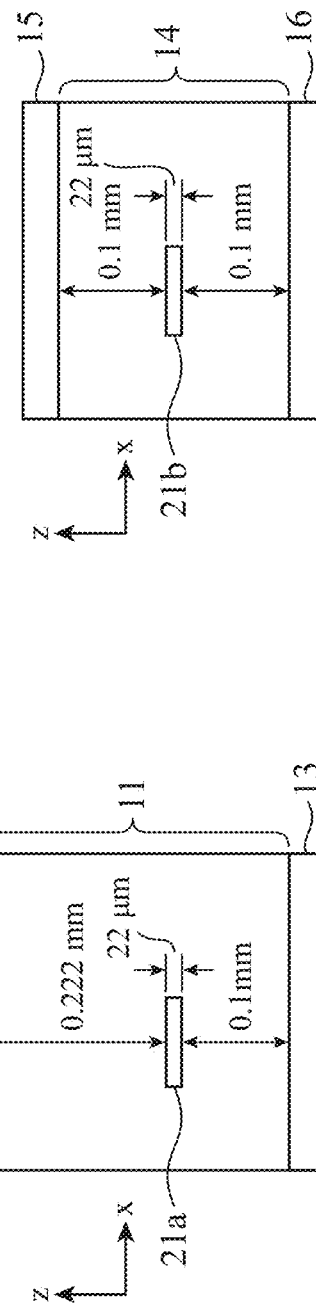
FIG. 7A
FIG. 7B
FIG. 7C

FIG. 18

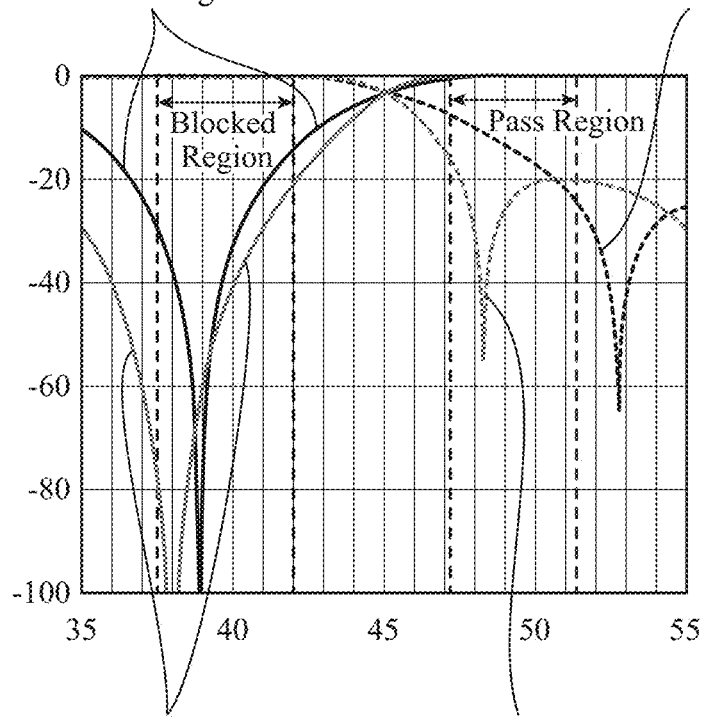

Passage Characteristics S21 of High Frequency Filter in Which Coupled Line 131 Serves as Vertical Feeding Portion Reflection Characteristics S11 of High Frequency Filter in Which Coupled Line 131 Serves as Vertical Feeding Portion Passage Characteristics S21 of High Frequency Filter Illustrated in Fig. 13

Reflection Characteristics S11 of High Frequency Filter Illustrated in Fig. 13

FIG. 19

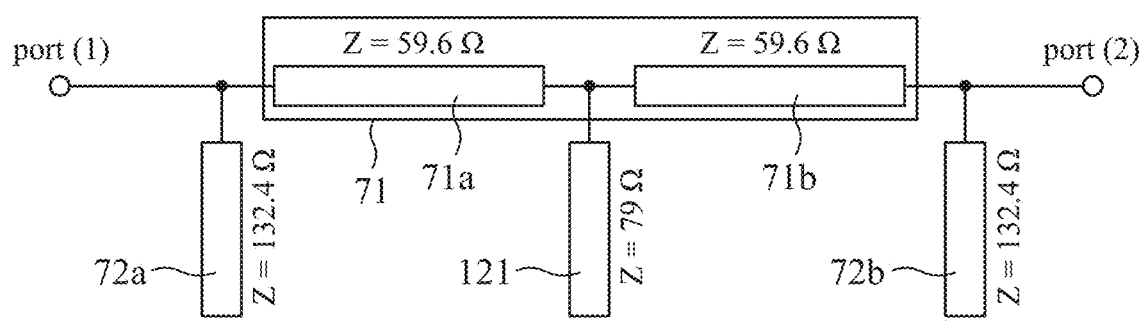

FIG. 20
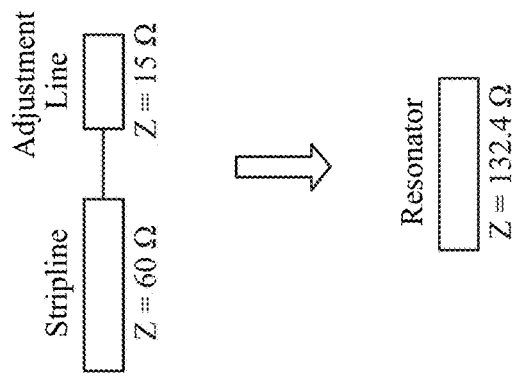
FIG. 21
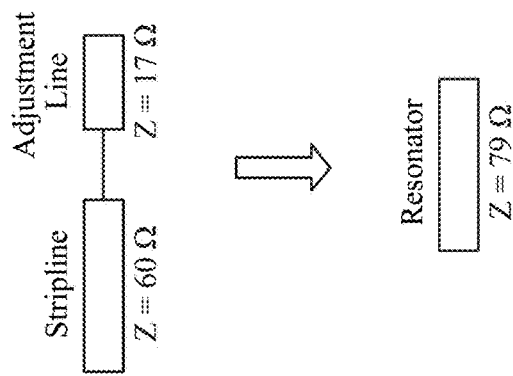
FIG. 22
Characteristic Impedance: $Z_i$
Electrical Length: 90 Degrees
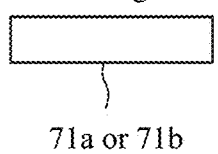
71a or 71b
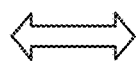
Characteristic Impedance: $Z_a$
Electrical Length: $\theta_a$
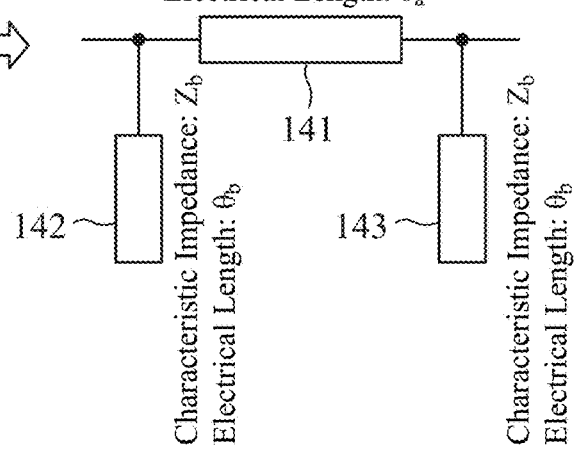

HIGH FREQUENCY FILTER

TECHNICAL FIELD

The present invention relates to a high frequency filter including open stubs acting as resonators and matching conductors acting as capacitance matching elements.

BACKGROUND ART

High frequency filters used in a microwave band or a millimeter-wave band are used in some cases, for example, in a thin antenna mounted on a mobile body in a satellite communication system.

A high frequency filter disclosed in the following Non-Patent Literature 1 includes a plurality of resonators disposed on the same plane in order to form a stop band which is a frequency band in which transmission of a signal is stopped.

CITATION LIST

Non-Patent Literature

Non-Patent Literature 1: "Micro Strip Filters for RF/Microwave Applications" P184

SUMMARY OF INVENTION

Technical Problem

In conventional high frequency filters, it is necessary to dispose a plurality of resonators on the same plane in order to form a stop band. Therefore, there is disadvantage that it is necessary to secure a region for disposing a plurality of resonators on the same plane.

The present invention is devised in order to solve the disadvantage as the above, and an object of the present invention is to obtain a high frequency filter capable of forming a stop band without disposing a plurality of resonators on the same plane.

Solution to Problem

A high frequency filter according to the present invention includes: a multilayer substrate including: a first substrate in which a first stripline is wired in an inner layer of the first substrate; a second substrate in which a second stripline is wired in an inner layer of the second substrate; and a third substrate inserted between the first substrate and the second substrate; and a coaxial line including: a first columnar conductor disposed inside the multilayer substrate such that one end of the first columnar conductor is coupled to the first stripline and that another end of the first columnar conductor is coupled to the second stripline; and one or more second columnar conductors penetrating the multilayer substrate such that one end of each of the one or more second columnar conductors is coupled to a ground layer formed on, of two surfaces of the first substrate, a surface opposite to a surface on which the third substrate is disposed and that another end of each of the one or more second columnar conductors is coupled to a ground layer formed on, of two surfaces of the second substrate, a plane opposite to a surface on which the third substrate is disposed, the first columnar conductor acting as an inner conductor, and the second columnar conductors acting as outer conductors. Each of the first and second striplines is coupled to an open stub acting as a resonator and a matching conductor acting as a capacitance matching element.

Advantageous Effects of Invention

According to the present invention, a high frequency filter includes: a coaxial line including: a first columnar conductor disposed inside the multilayer substrate such that one end of the first columnar conductor is coupled to the first stripline and that another end of the first columnar conductor is coupled to the second stripline; and one or more second columnar conductors penetrating the multilayer substrate such that one end of each of the one or more second columnar conductors is coupled to a ground layer formed on, of two surfaces of the first substrate, a surface opposite to a surface on which the third substrate is disposed and that another end of each of the one or more second columnar conductors is coupled to a ground layer formed on, of two surfaces of the second substrate, a plane opposite to a surface on which the third substrate is disposed, the first columnar conductor acting as an inner conductor, and the second columnar conductors acting as outer conductors. Each of the first and second striplines is coupled to an open stub acting as a resonator and a matching conductor acting as a capacitance matching element. Therefore, the high frequency filter according to the present invention has an effect of forming a stop band without disposing a plurality of resonators on the same plane.

BRIEF DESCRIPTION OF DRAWINGS

FIG. 7A is an explanatory diagram illustrating detailed dimensions of the high frequency filter illustrated in FIG. 2, FIG. 7B is an explanatory diagram illustrating detailed dimensions in the vicinity of a first substrate 11 in the high frequency filter illustrated in FIG. 2, and FIG. 7C is an explanatory diagram illustrating detailed dimensions in the vicinity of a second substrate 14 in the high frequency filter illustrated in FIG. 2.

FIG. 18 is an explanatory graph illustrating a result of an electromagnetic field analysis of reflection characteristics and passage characteristics in the high frequency filter illustrated in FIG. 13 and a result of an electromagnetic field analysis of reflection characteristics and passage characteristics in a high frequency filter in which a coupled line 131 forms a vertical feeding portion (see FIG. 17).

FIG. 19 is an explanatory diagram illustrating characteristic impedance of resonators 72a, 72b, and 121.

FIG. 20 is an explanatory diagram illustrating a resonator in which a line for adjusting characteristic impedance is coupled to a stripline.

FIG. 21 is an explanatory diagram illustrating a resonator in which a line for adjusting characteristic impedance is coupled to a stripline.

FIG. 22 is an explanatory diagram illustrating the correspondence between each of lines 71a and 71b included in a coupled line 71 and a π-type circuit.

DESCRIPTION OF EMBODIMENTS

To describe the present invention more in detail, some embodiments for carrying out the present invention will be described below with reference to the accompanying drawings.

First Embodiment

Figure 1:
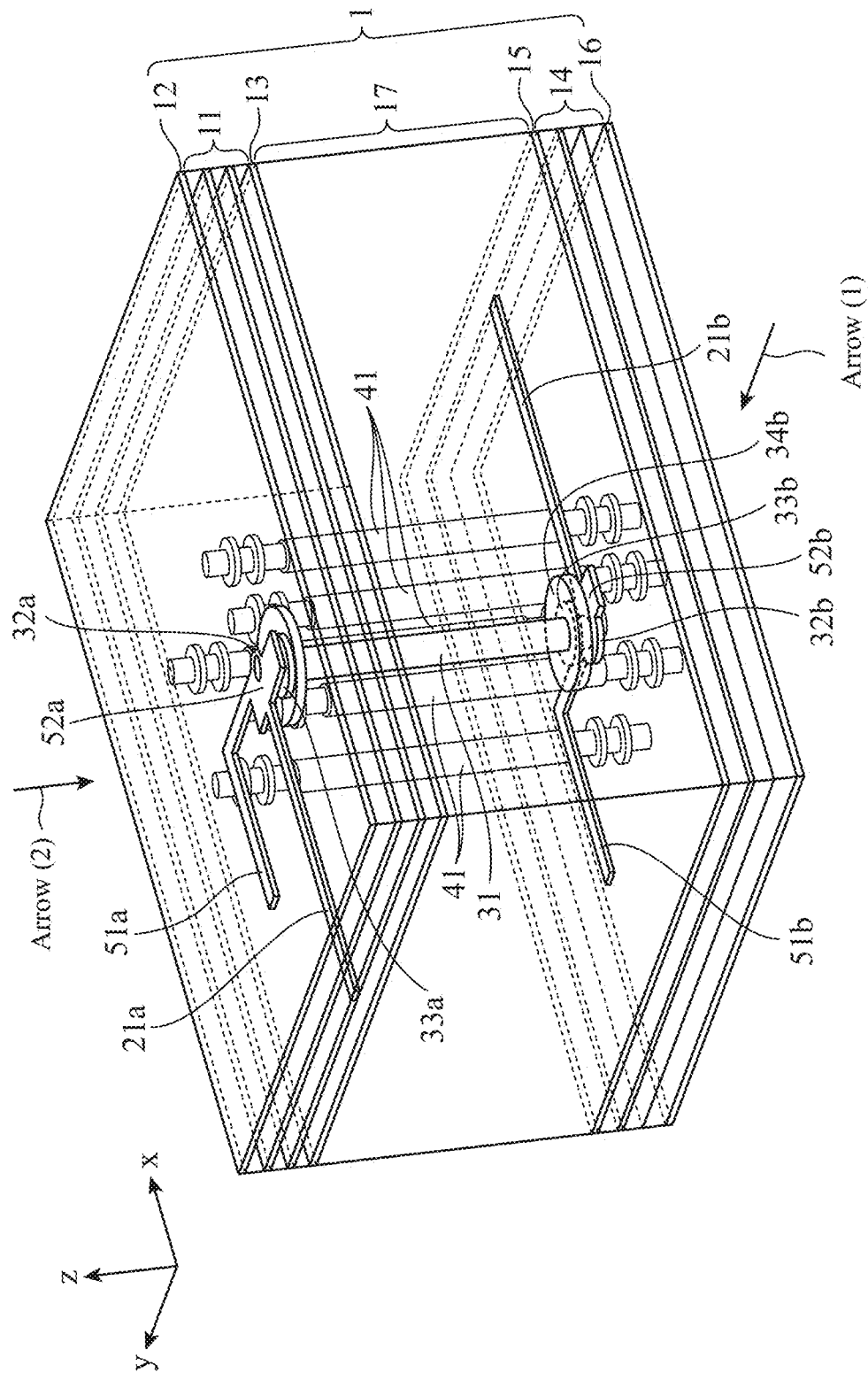
FIG. 1 is a perspective view illustrating a high frequency filter according to a first embodiment.

FIG. 1 is a perspective view illustrating a high frequency filter according to a first embodiment.

Figure 2:
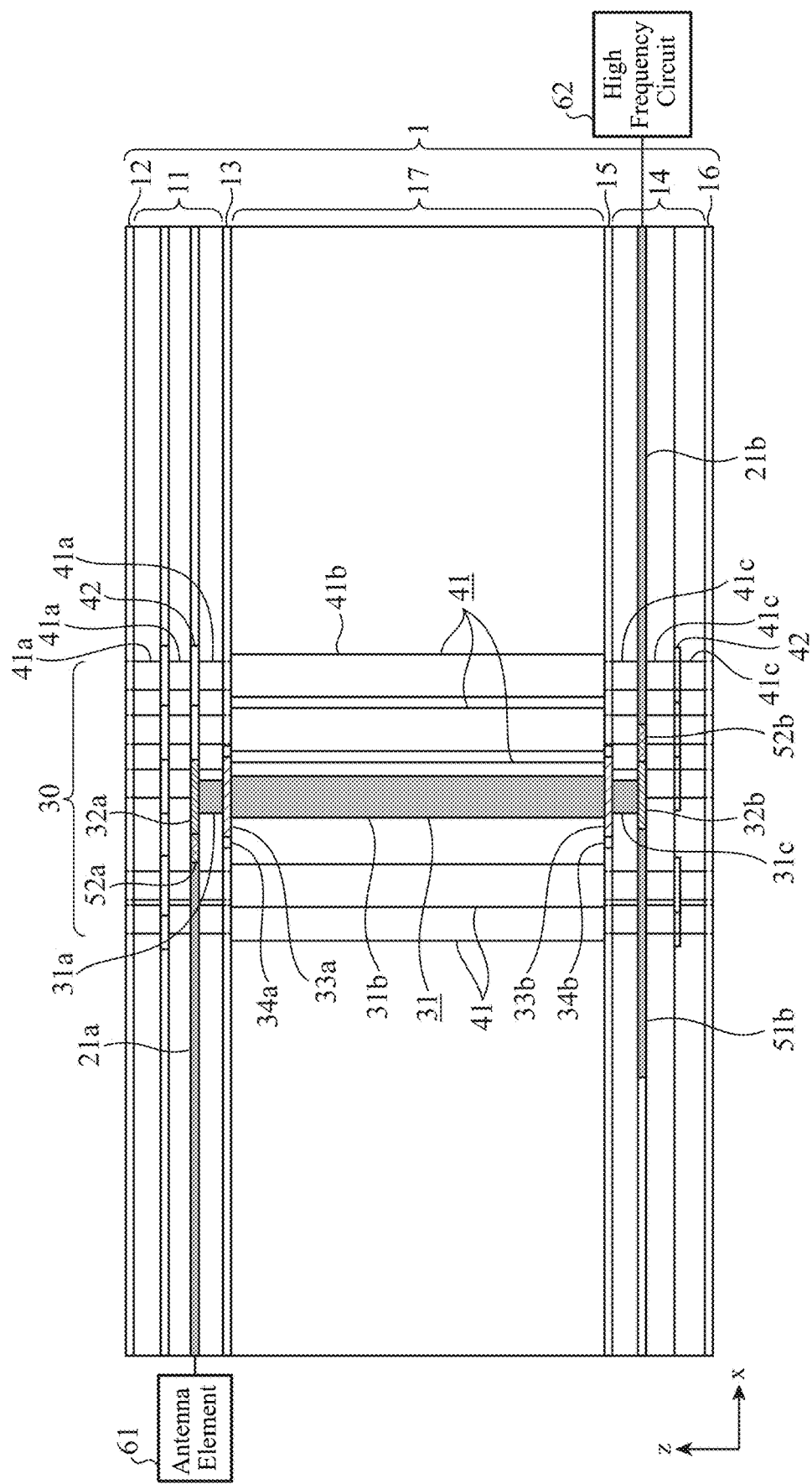
FIG. 2 is a side view of a main part of the high frequency filter of FIG. 1 when viewed from a direction indicated by arrow (1).

FIG. 2 is a side view of a main part of the high frequency filter of FIG. 1 when viewed from a direction indicated by arrow (1).

Figure 3:
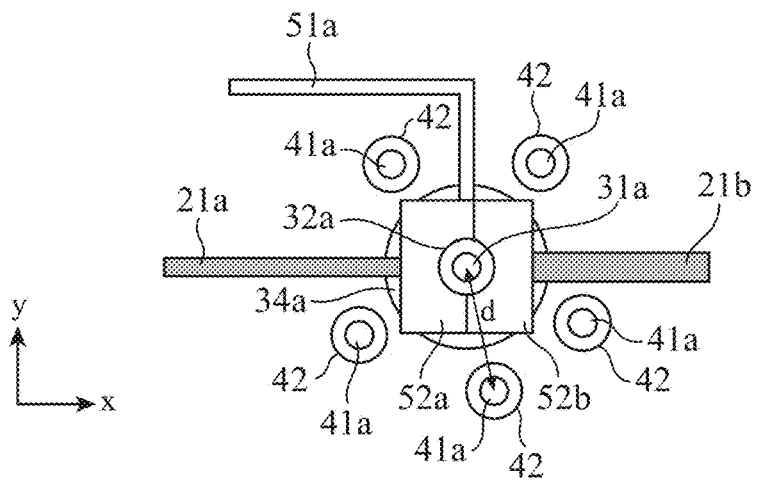
FIG. 3 is a plan view of the main part of the high frequency filter of FIG. 1 when viewed from a direction indicated by arrow (2).

FIG. 3 is a plan view of the main part of the high frequency filter of FIG. 1 when viewed from a direction indicated by arrow (2).

The direction indicated by arrow (1) is the +y direction in the coordinate system of the high frequency filter.

The direction indicated by arrow (2) is the −z direction in the coordinate system of the high frequency filter.

In FIGS. 1 to 3, a multilayer substrate 1 is a dielectric substrate of a multilayer structure including a first substrate 11, a second substrate 14, and a third substrate 17.

A ground layer 12 is formed on the front surface of the first substrate 11, and a ground layer 13 is formed on the back surface of the first substrate 11. The front surface of the first substrate 11 is, of the two surfaces of the first substrate 11, a surface opposite to the surface on which the third substrate 17 is disposed, and the back surface of the first substrate 11 is the surface on which the third substrate 17 is disposed.

In an inner layer of the first substrate 11, a first stripline 21a is wired.

A ground layer 15 is formed on the front surface of the second substrate 14, and a ground layer 16 is formed on the back surface of the second substrate 14. The front surface of the second substrate 14 is, of the two surfaces of the second substrate 14, a surface on which the third substrate 17 is disposed, and the back surface of the second substrate 14 is a surface opposite to the surface on which the third substrate 17 is disposed.

In addition, a second stripline 21b is wired in an inner layer of the second substrate 14.

A third substrate 17 is inserted between the first substrate 11 and the second substrate 14.

A coaxial line 30 includes an inner conductor and outer conductors.

A first columnar conductor 31 is an inner conductor of the coaxial line 30 in which columnar conductors 31a, 31b, and 31c are disposed linearly and the columnar conductors 31a, 31b, and 31c are electrically coupled.

The columnar conductor 31a is disposed inside the first substrate 11, and one end thereof is electrically coupled to the first stripline 21a via a coupling member 32a.

The columnar conductor 31b is disposed inside the third substrate 17, and one end thereof is electrically coupled to the other end of the columnar conductor 31a via a coupling member 33a.

The columnar conductor 31c is disposed inside the second substrate 14, one end thereof is electrically coupled to the other end of the columnar conductor 31b via a coupling member 33b, and the other end thereof is electrically coupled to the second stripline 21b via a coupling member 32b.

A hole 34a is formed in the ground layer 13, and the coupling member 33a is formed inside the hole 34a.

A hole 34b is formed in the ground layer 15, and the coupling member 33b is formed inside the hole 34b.

Each of second columnar conductors 41 is an outer conductor penetrating the multilayer substrate 1 in such a manner that one end thereof is coupled to the ground layer 12 and the other end thereof is coupled to the ground layer 16.

In each second columnar conductor 41, columnar conductors 41a, 41b, and 41c are disposed linearly, and the columnar conductors 41a, 41b, and 41c are electrically coupled.

The columnar conductor 41a is disposed inside the first substrate 11, and one end thereof is coupled to the ground layer 12.

The columnar conductor 41b is disposed inside the third substrate 17, and one end thereof is electrically coupled to the columnar conductor 41a.

The columnar conductor 41c is disposed inside the second substrate 14, one end thereof is electrically coupled to the other end of the columnar conductor 41b, and the other end thereof is coupled to the ground layer 16.

Although illustration is omitted for simplification of the drawing, a coupling member for electrically coupling the columnar conductor 41a and the columnar conductor 41b may be provided, and a coupling member for electrically coupling the columnar conductor 41b and the columnar conductor 41c may be provided.

A land 42 is a member for fixing the columnar conductors 41a and 41c.

FIG. 1 illustrates an example in which five second columnar conductors 41 are disposed as outer conductors so as to surround the first columnar conductor 31 as an inner conductor. However, it is only required that one or more outer conductors are disposed.

Note that the distance between the first columnar conductor 31 as the inner conductor and a second columnar conductor 41 as the outer conductor is d as illustrated in FIG. 3.

An open stub 51a is formed inside the first substrate 11 and is electrically coupled to the first stripline 21a via the coupling member 32a. The open stub 51a acts as a resonator.

An open stub 51b is formed inside the second substrate 14 and is electrically coupled to the second stripline 21b via the coupling member 32b. The open stub 51b acts as a resonator.

The open stub 51a is formed inside the first substrate 11, which is formed with the ground layers 12 and 13 on the front and back surfaces thereof, respectively, and the open stub 51b is formed inside the second substrate 14, which is formed with the ground layers 15 and 16 on the front and back surfaces thereof, respectively.

For this reason, the open stubs 51a and 51b are disposed in the state of being electrically shielded in the ±z direction (vertical direction in the drawing) in FIG. 2.

A matching conductor 52a is formed inside the first substrate 11 and is electrically coupled between the coupling member 32a and the first stripline 21a. The matching conductor 52a has sides having a wider width than the width of the first stripline 21a and the width of the open stub 51a, and acts as a capacitance matching element.

A matching conductor 52b is formed inside the second substrate 14, and is electrically coupled between the coupling member 32b and the second stripline 21b. The matching conductor 52b has sides having a wider width than the width of the second stripline 21b and the width of the open stub 51b, and acts as a capacitance matching element.

An antenna element 61 is electrically coupled to the first stripline 21a in the high frequency filter, and transmits and receives electromagnetic waves.

The high frequency circuit 62 is electrically coupled to the second stripline 21b in the high frequency filter and is mounted with, for example, an amplifier for amplifying a signal input to/output from the high frequency filter.

Figure 4:
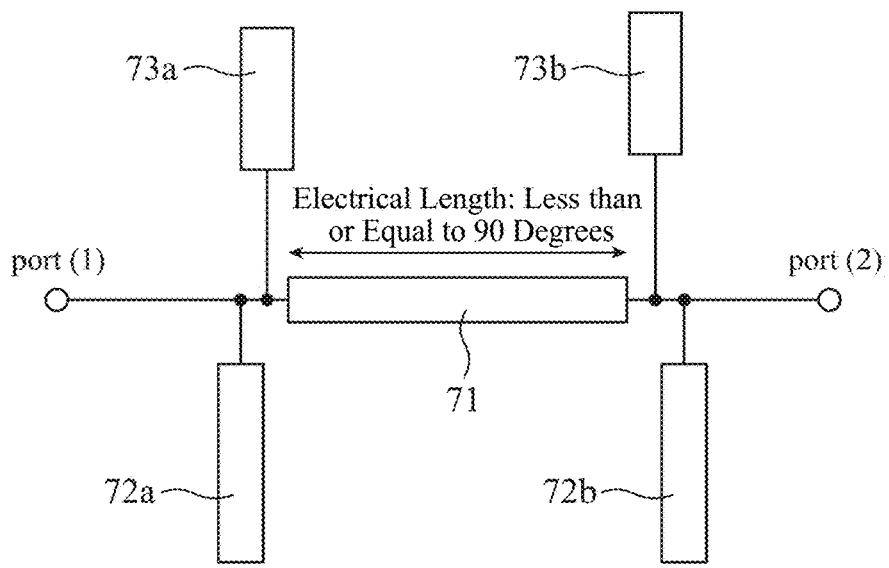
FIG. 4 is an explanatory diagram illustrating an equivalent circuit of the high frequency filter illustrated in FIG. 1.

FIG. 4 is an explanatory diagram illustrating an equivalent circuit of the high frequency filter illustrated in FIG. 1.

In FIG. 4, a coupled line 71 is a line formed by the first columnar conductor 31 in the coaxial line 30, and a ground, which is formed to correspond to this line, corresponds to the second columnar conductors 41.

The electrical length of the coupled line 71 corresponds to the electrical length of the first columnar conductor 31, and is less than or equal to 90 degrees at the center frequency of a stop band which is a frequency band in which transmission of a signal is stopped.

The characteristic impedance of the coupled line 71 is determined by the diameter of the first columnar conductor 31 and the distance d between the first columnar conductor 31 and the second columnar conductors 41.

Since the electrical length of the columnar conductors 31a and 31c is much shorter than the electrical length of the columnar conductor 31b, the diameter of the first columnar conductor 31 is substantially equivalent to the diameter of the columnar conductor 31b.

A resonator 72a corresponds to the open stub 51a, and is adjusted to have an electrical length of 90 degrees at the center frequency of the stop band.

A resonator 72b corresponds to the open stub 51b, and is adjusted to have an electrical length of 90 degrees at the center frequency of the stop band.

A capacitance matching element 73a corresponds to the matching conductor 52a, and the capacitance matching element 73b corresponds to the matching conductor 52b.

Next, the operation will be described.

The high frequency filter disclosed in Non-Patent Literature 1 includes a plurality of resonators disposed on the same plane in order to form a stop band.

Each of the resonators corresponds to an open stub having an electrical length of 90 degrees at the center frequency of the stop band.

Figure 5:
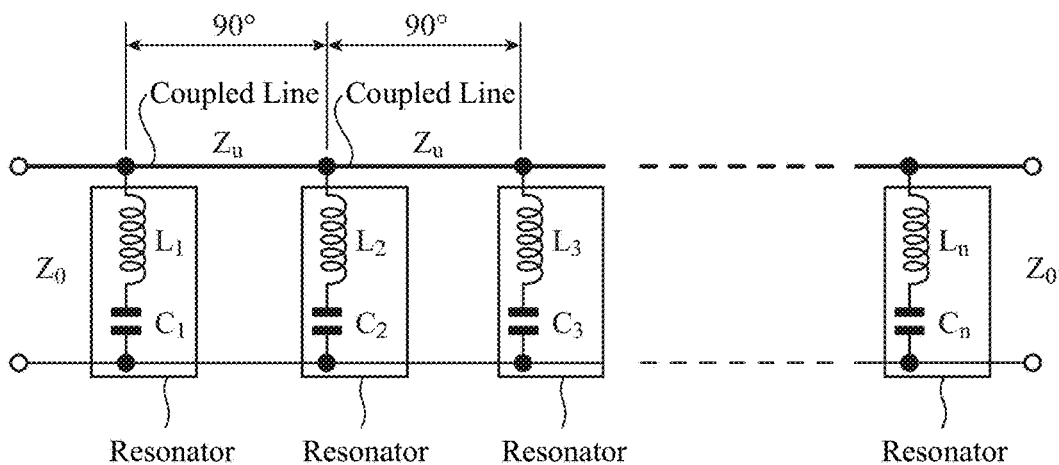
FIG. 5 is a configuration diagram illustrating a high frequency filter disclosed in Non-Patent Literature 1.

FIG. 5 is a configuration diagram illustrating a high frequency filter disclosed in Non-Patent Literature 1.

Figure 6:
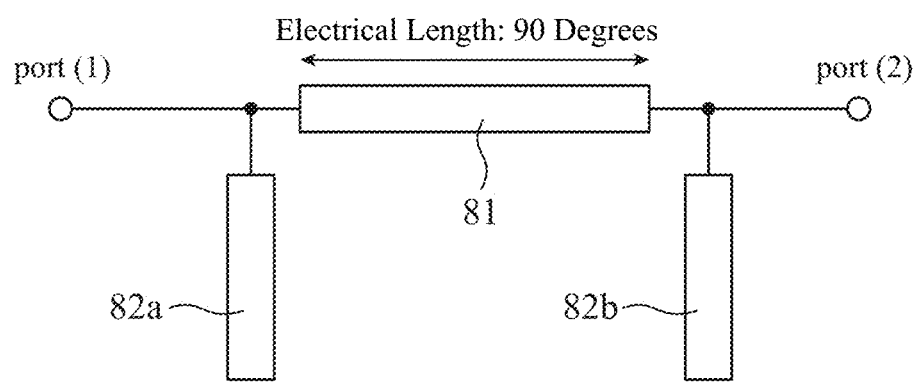
FIG. 6 is an explanatory diagram illustrating an equivalent circuit of the high frequency filter in FIG. 5.

FIG. 6 is an explanatory diagram illustrating an equivalent circuit of the high frequency filter in FIG. 5.

Note that FIG. 6 illustrates an example in which there are one coupled line and two resonators.

A coupled line 81 corresponds to a coupled line in the high frequency filter of FIG. 5 and is adjusted to have an electrical length of 90 degrees at the center frequency of a desired stop band. A desired stop band is a frequency band in which transmission of a signal is stopped.

Resonators 82a and 82b correspond to resonators in the high frequency filter of FIG. 5 and are adjusted to have the electrical length of 90 degrees at the center frequency of the desired stop band.

When each of the coupled line 81 and the resonators 82a and 82b has the electrical length of 90 degrees at the center frequency of the desired stop band, and is adjusted to have desired characteristic impedance, a high frequency filter having the desired stop band can be obtained. Desired characteristic impedance is, for example, characteristic impedance designed by a designer of the high frequency filter.

Non-Patent Literature 1 discloses how to determine a parameter value of the coupled line 81 and parameter values of the resonators 82a and 82b included in the high frequency filter having the desired stop band.

Examples of the parameter value of the coupled line 81 and the parameter values of the resonators 82a and 82b include characteristic impedance.

Comparing the high frequency filter according to the first embodiment with the high frequency filter disclosed in Non-Patent Literature 1, they are in common in the point that the resonators 72a and 72b and the resonators 82a and 82b have the electrical length of 90 degrees at the center frequency of the stop band.

The high frequency filter according to the first embodiment is different in that the electrical length of the coupled line 71 has an electrical length less than or equal to 90 degrees at the center frequency of a stop band, whereas, in the high frequency filter disclosed in Non-Patent Literature 1, the electrical length of the coupled line 81 has the electrical length of 90 degrees at the center frequency of a stop band.

Moreover, the high frequency filter of the first embodiment is different in that the capacitance matching elements 73a and 73b are included, whereas the high frequency filter disclosed in Non-Patent Literature 1 includes no capacitance matching elements.

In the high frequency filter of the first embodiment, the equivalent circuit is represented by the capacitance matching elements 73a and 73b, the coupled line 71, and the resonators 72a and 72b.

The characteristic impedances of the resonators 72a and 72b are set to, for example, the same characteristic impedances as those of the resonators 82a and 82b determined in the manner disclosed in Non-Patent Literature 1.

Note that the characteristic impedance of the coupled line 71 to which the capacitance matching elements 73a and 73b are coupled may be different from the characteristic impedance of the coupled line 81 determined in the manner disclosed in Non-Patent Literature 1. For example, there are cases where the characteristic impedance of the coupled line 71 is adjusted in such a manner that passage characteristics from Port (1) to Port (2) of the circuit including the capacitance matching elements 73a and 73b and the coupled line 71 and reflection characteristics at each of the ports thereof are substantially equal to passage characteristics from Port (1) to Port (2) of the circuit including only the coupled line 81 and reflection characteristics at each of the ports thereof, respectively.

The characteristic impedance of the coupled line 71 itself is determined by the diameter of the first columnar conductor 31 and the distance d between the first columnar conductor 31 and the second columnar conductors 41.

Here, FIG. 7A is an explanatory diagram illustrating detailed dimensions of the high frequency filter illustrated in FIG. 2.

FIG. 7B is an explanatory diagram illustrating detailed dimensions in the vicinity of the first substrate 11 in the high frequency filter illustrated in FIG. 2, and FIG. 7C is an explanatory diagram illustrating detailed dimensions in the vicinity of the second substrate 14 in the high frequency filter illustrated in FIG. 2.

Figure 8A:
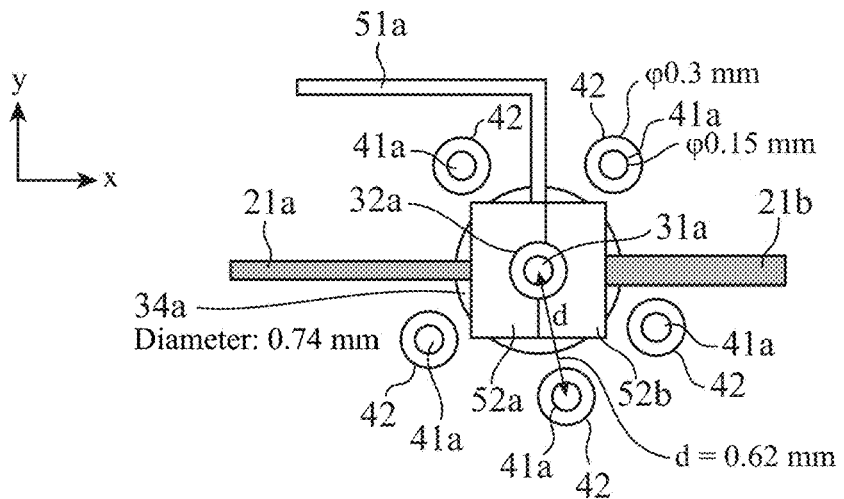
FIG. 8A is an explanatory diagram illustrating detailed dimensions of the high frequency filter illustrated in FIG. 3.

FIG. 8A is an explanatory diagram illustrating detailed dimensions of the high frequency filter illustrated in FIG. 3.

Figure 8B:
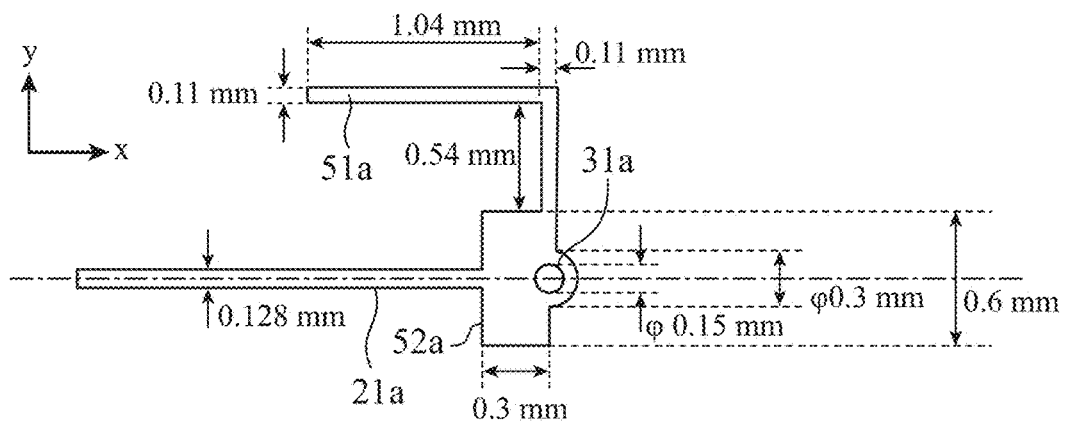
FIG. 8B is an explanatory diagram illustrating detailed dimensions of a first stripline 21a, an open stub 51a, and a matching conductor 52a in the high frequency filter illustrated in FIG. 3.
Figure 8C:
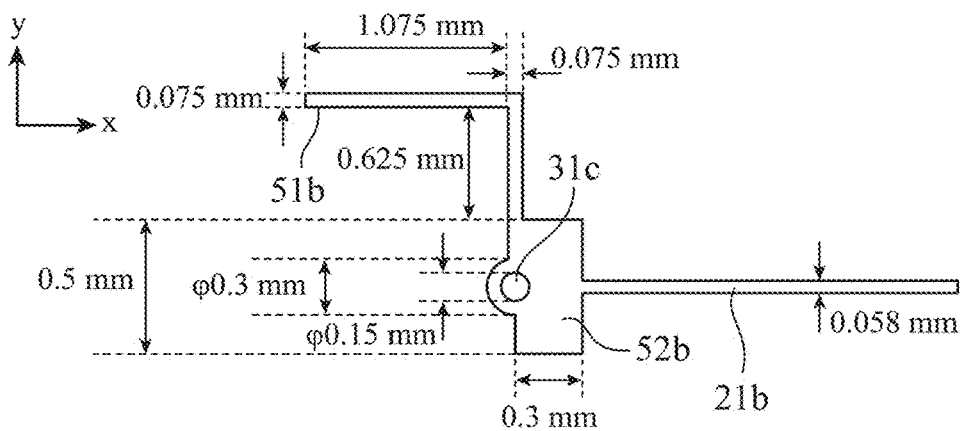
FIG. 8C is an explanatory diagram illustrating detailed dimensions of a second stripline 21b, an open stub 51b, and a matching conductor 52b in the high frequency filter illustrated in FIG. 3.

FIG. 8B is an explanatory diagram illustrating detailed dimensions of the first stripline 21a, the open stub 51a, and the matching conductor 52a in the high frequency filter illustrated in FIG. 3, and FIG. 8C is an explanatory diagram illustrating detailed dimensions of the second stripline 21b, the open stub 51b, and the matching conductor 52b in the high frequency filter illustrated in FIG. 3.

It is assumed that, in the case where detailed dimensions of the high frequency filter are the dimensions illustrated in FIG. 7 and FIG. 8, the characteristic impedance of the coupled line 71 having a center frequency Fc of 19.45 GHz of a stop band and an electrical length of 80 degrees at the center frequency Fc is assumed to be 70Ω.

It is further assumed that the characteristic impedance of the resonators 72a and 72b having the electrical length of 90 degrees at the center frequency Fc is assumed to be 52Ω and that the characteristic impedance of the capacitance matching elements 73a and 73b having an electrical length of 5 degrees at the center frequency Fc is assumed to be 15Ω.

It is assumed that, as the multilayer substrate 1, a substrate having a dielectric constant of 3.62 and a dielectric loss tangent of 0.002 is used.

Figure 9:
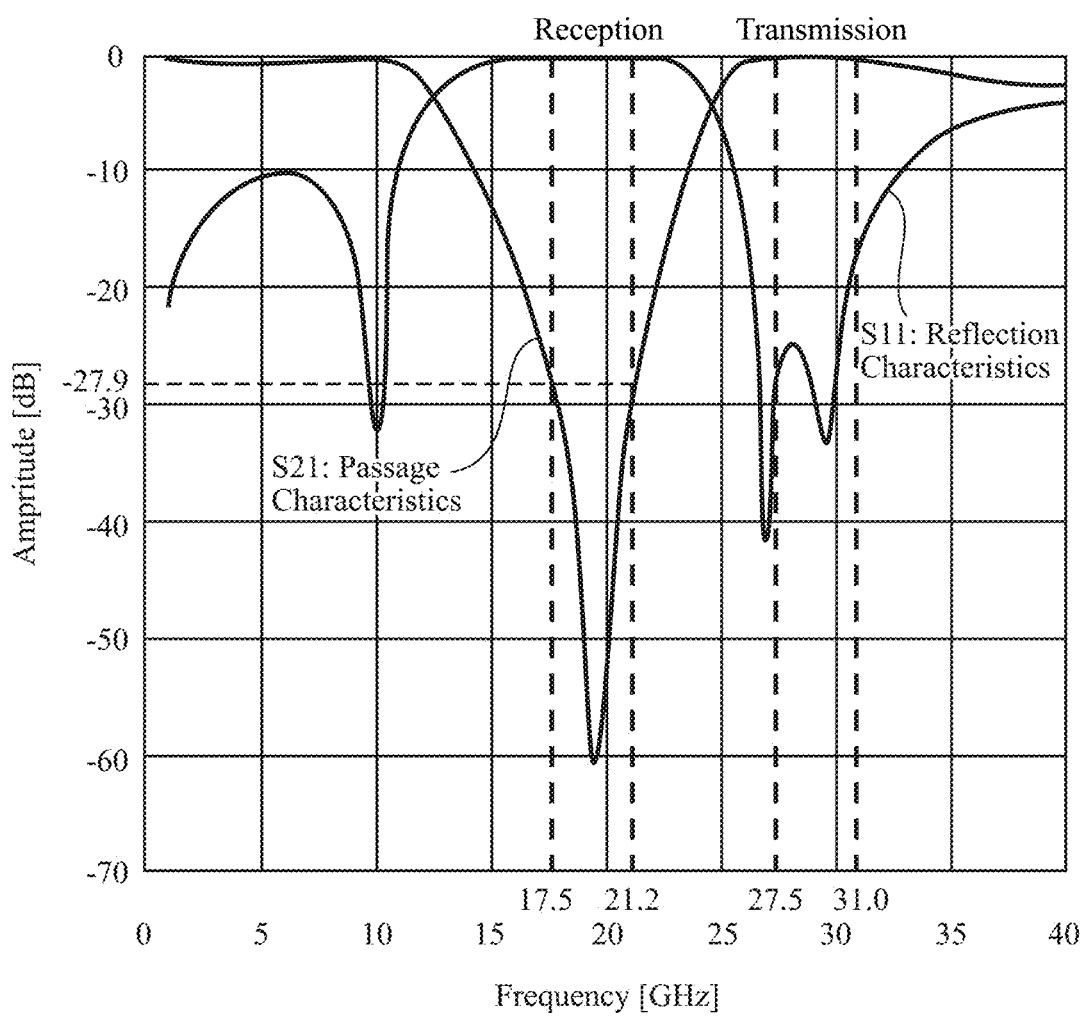
FIG. 9 is an explanatory graph illustrating a result of an electromagnetic field analysis of reflection characteristics and passage characteristics in the high frequency filter.

In the case where the dimensions, the electrical lengths, and the characteristic impedances are the above values, by performing an electromagnetic field analysis of reflection characteristics and passage characteristics in the high frequency filter, the result of the electromagnetic field analysis of reflection characteristics and passage characteristics as illustrated in FIG. 9 is obtained.

FIG. 9 is an explanatory graph illustrating the result of the electromagnetic field analysis of reflection characteristics and passage characteristics in the high frequency filter.

In FIG. 9, the horizontal axis represents the frequency, and the vertical axis represents the signal level.

As illustrated by passage characteristics S21 illustrated in FIG. 9, the amount stopped in a stop band of 17.5 to 21.2 GHz is lower than or equal to −27.9 dB, and the passage loss within 27.5 to 31.0 GHz is no lower than −0.26 dB.

The stopped amount of lower than or equal to −27.9 dB and a passage loss of no lower than −0.26 dB satisfy the characteristics of a band-stop filter in the Kurz-above (Ka) band.

As apparent from the above, according to the first embodiment, the high frequency filter includes: the coaxial line 30 including: a coaxial line 30 including: a first columnar conductor 31 disposed inside the multilayer substrate 1 such that one end of the first columnar conductor is coupled to the first stripline 21a and that another end of the first columnar conductor is coupled to the second stripline 21b; and one or more second columnar conductors 41 penetrating the multilayer substrate 1 such that one end of each of the one or more second columnar conductors 41 is coupled to a ground layer 12 and that another end of each of the one or more second columnar conductors 41 is coupled to a ground layer 16, the first columnar conductor 31 acting as an inner conductor, and the second columnar conductors 41 acting as outer conductors. Each of the first and second striplines 21a, 21b is coupled to an open stub 51a, 51b acting as a resonator 72a, 72b and a matching conductor 52a, 52b acting as a capacitance matching element 73a, 73b. Therefore, the high frequency filter can form a stop band without disposing a plurality of resonators on the same plane.

As a result, a high frequency filter having a smaller area for mounting as compared with the high frequency filter disclosed in Non-Patent Literature 1 can be obtained.

In the first embodiment, the example is illustrated in which the open stub 51a and the matching conductor 52a are both formed on the same plane in the first substrate 11, and the open stub 51b and the matching conductor 52b are both formed on the same plane in the second substrate 14.

Note that this is merely an example, and the open stub 51a and the matching conductor 52a may be formed on different planes, respectively, in the first substrate 11, and the open stub 51b and the matching conductor 52b may be formed on different planes, respectively, in the second substrate 14.

Alternatively, the open stub 51a and the matching conductor 52a may be both formed in the third substrate 17, and the open stub 51b and the matching conductor 52b may be both formed in the third substrate 17.

Figure 10:
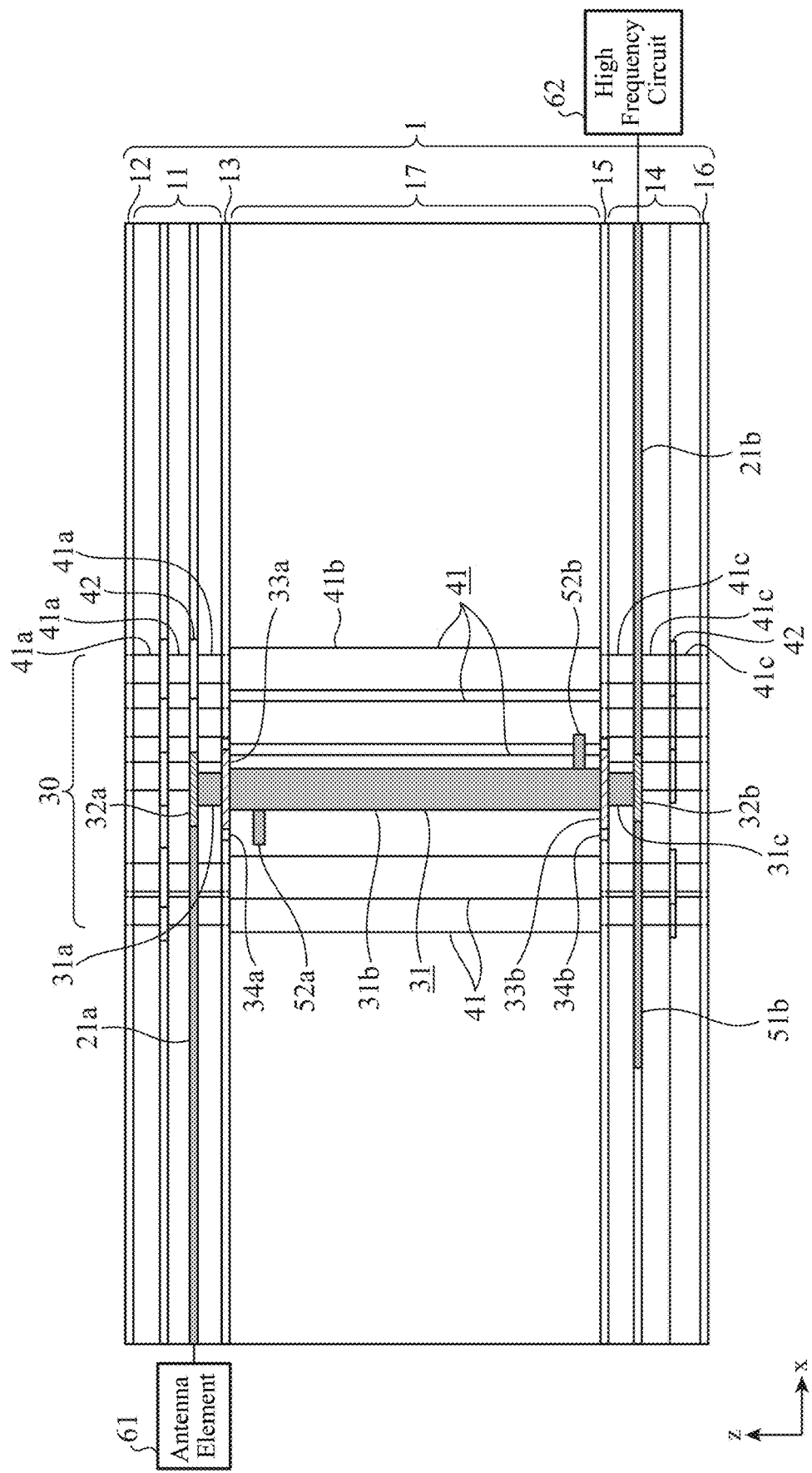
FIG. 10 is a side view illustrating a main part of another high frequency filter according to the first embodiment of the invention.

Further alternatively as illustrated in FIG. 10, the open stub 51a and the matching conductor 52a may be formed in different substrates, respectively, and the open stub 51b and the matching conductor 52b may be formed in different substrates, respectively.

FIG. 10 is a side view illustrating a main part of another high frequency filter according to the first embodiment.

In the example of FIG. 10, an open stub 51a is formed in a first substrate 11, whereas a matching conductor 52a is formed in a third substrate 17. An open stub 51b is formed in a second substrate 14, whereas a matching conductor 52b is formed in the third substrate 17.

Note that a design in which the open stub 51a is formed in the third substrate 17 and the matching conductor 52a is formed in the first substrate 11 may be adopted. Alternatively, a design in which the open stub 51b is formed in the third substrate 17 and the matching conductor 52b is formed in the second substrate 14 may be adopted.

Figure 11:
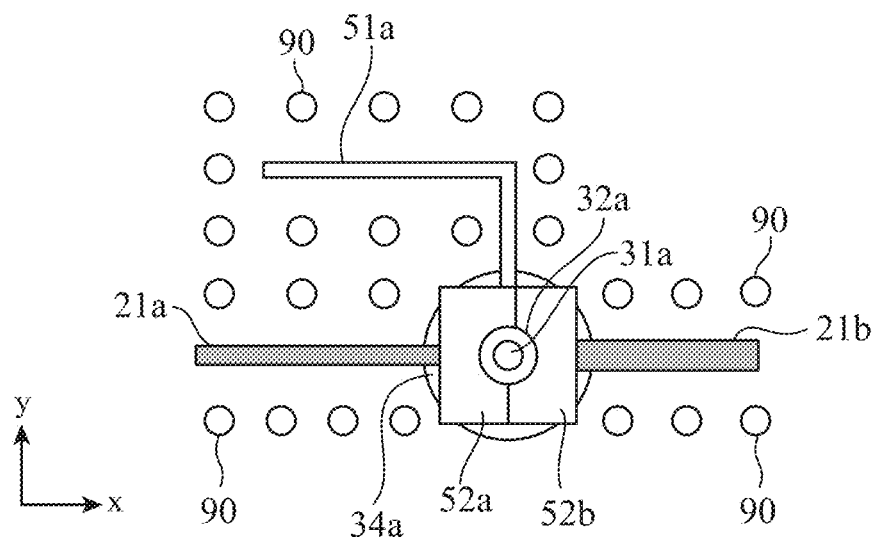
FIG. 11 is a plan view illustrating the main part of another high frequency filter according to the first embodiment.

In the high frequency filter according to the first embodiment, columnar conductors 90 may be loaded around the first stripline 21a and the second stripline 21b as illustrated in FIG. 11 for the purpose of prevention of electrical interference on circuits coupled to the first stripline 21a and the second stripline 21b. In addition, columnar conductors 90 may be further loaded around the open stubs 51a and 51b.

For example, it is assumed that one end of a columnar conductor 90 is coupled to the ground layer 12 and that the other end of the columnar conductor 90 is coupled to the ground layer 16. As a circuit coupled to the second stripline 21b, a high frequency circuit 62 can be referred to, for example.

FIG. 11 is a plan view illustrating a main part of another high frequency filter according to the first embodiment.

In the example of FIG. 11, illustration of the second columnar conductors 41 and the lands 42 is omitted to simplify the drawing.

Although the example in which each of the open stubs 51a and 51b is bent into an L shape is illustrated in the first embodiment, each of the open stubs 51a and 51b may have a linear shape.

In the first embodiment, the open stub 51a is formed inside the first substrate 11 formed with the ground layers 12 and 13 on the front and back surfaces thereof, respectively, and the open stub 51b is formed inside the second substrate 14 formed with the ground layers 15 and 16 on the front and back surfaces thereof, respectively.

For this reason, the open stubs 51a and 51b are disposed in the state of being electrically shielded in the ±z direction (vertical direction in the drawing) in FIG. 2.

In this configuration, electric interference by the open stubs 51a and 51b on a circuit (not illustrated) can be prevented, the circuit being disposed in the +z direction (upward direction in the drawing) from the ground layer 12 or the −z direction (downward direction in the drawing) from the ground layer 16, for example. In addition, since the characteristic impedance of the open stubs 51a and 51b becomes unlikely to be influenced by a circuit or the like disposed in the +z direction (upward direction in the drawing) from the ground layer 12, setting of the characteristic impedance of the open stubs 51a and 51b becomes easier.

Although the distance between the open stub 51a and the open stub 51b is not specifically mentioned in the first embodiment, it may be an electrical length of less than or equal to 90 degrees at the center frequency Fc of the stop band.

In the first embodiment, filtering characteristics of the high frequency filter can be adjusted by changing the electrical lengths of the matching conductors 52a and 52b acting as the capacitance matching elements 73a and 73b, and thus a desired stop band can be formed even in the case where the distance between the open stub 51a and the open stub 51b is an electrical length of less than or equal to 90 degrees at the center frequency Fc of the stop band.

Second Embodiment

Figure 12:
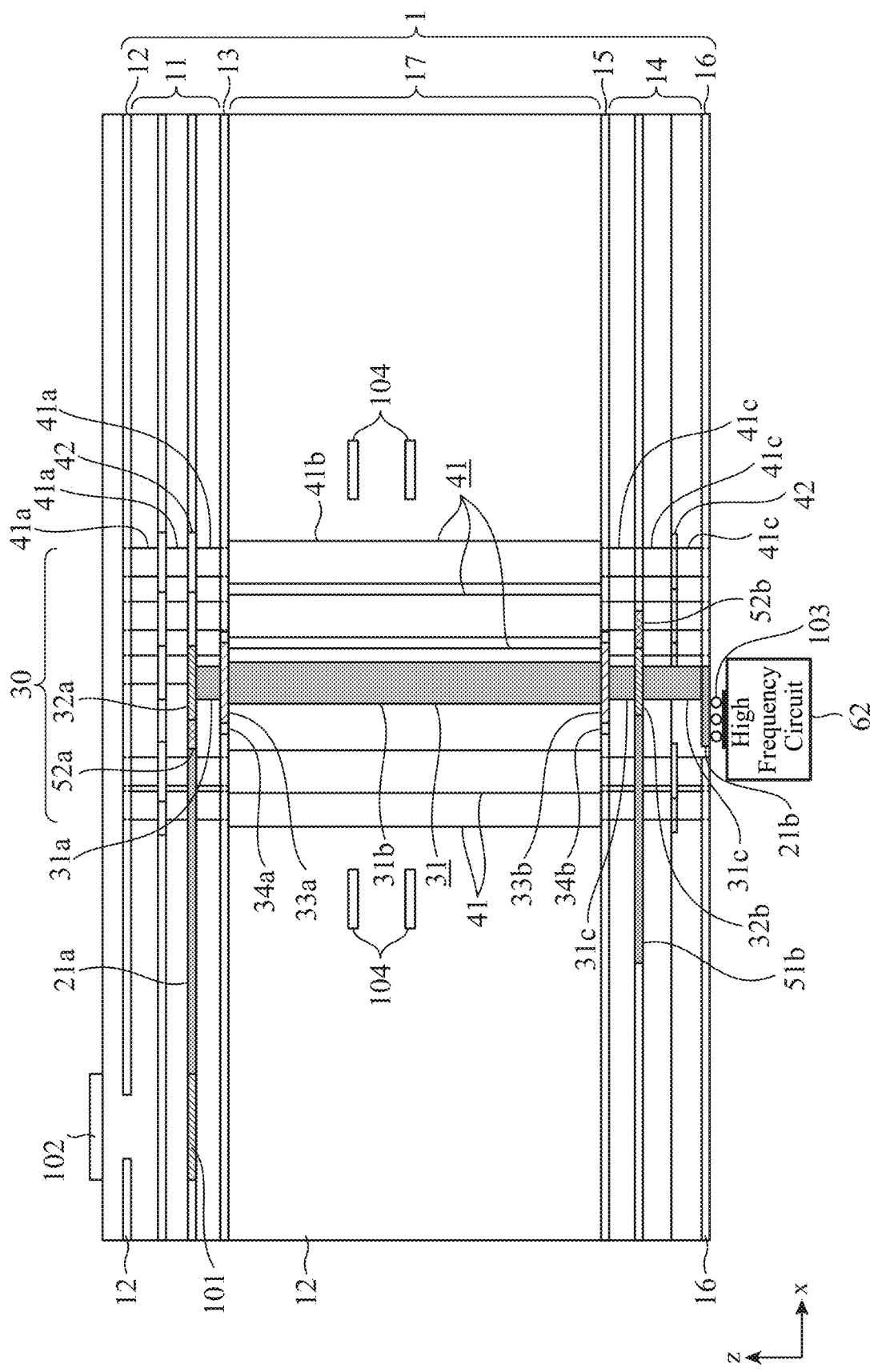
FIG. 12 is a side view illustrating a main part of a high frequency filter according to a second embodiment.

In the first embodiment, the example in which the antenna element 61 is provided externally to the high frequency filter is illustrated; however, an antenna element 101 may be disposed inside a high frequency filter as illustrated in FIG. 12.

FIG. 12 is a side view illustrating a main part of a high frequency filter according to a second embodiment.

In FIG. 12, the same symbols as those in FIG. 2 represent the same or corresponding parts and thus description thereof is omitted.

The antenna element 101 is disposed in a first substrate 11 and electrically coupled to a first stripline 21a, and is a driven element that transmits and receives an electromagnetic wave.

Although the single antenna element 101 is coupled to the first stripline 21a in FIG. 12, a plurality of antenna elements 101 may be coupled to the first stripline 21a.

In a case where a plurality of antenna elements 101 is arrayed, distances between the antenna elements 101 may be narrowed by placing a filter or the like between the antenna elements 101. By narrowing the distances between the antenna elements 101, it is possible to suppress grating lobes or the like that are generated due to wide distances between the antenna elements 101.

In the example of FIG. 12, a parasitic element 102 is disposed in the +z direction (upward direction in the drawing) from the antenna element 101; however, the parasitic element 102 is not necessarily disposed.

A high frequency circuit 62 is electrically coupled to a second stripline 21b via a ball grid array (BGA) 103. The BGA 103 is a package substrate having electrodes in which solder balls are arranged in a grid.

In the second embodiment, the second stripline 21b is disposed in the same plane as a ground layer 16, and a columnar conductors 31c in a first columnar conductor 31 extends to the stripline 21b disposed on the ground layer 16.

Wiring 104 is a control wiring, power supply wiring, or the like, provided in a space in a third substrate 17.

Even in a case where the antenna element 101 is disposed inside the high frequency filter as illustrated in FIG. 12, a stop band can be formed without disposing a plurality of resonators on the same plane like in the first embodiment.

Also in the high frequency filter of the second embodiment, columnar conductors 90 may be loaded around the first stripline 21a and the second stripline 21b like in the high frequency filter of the first embodiment. In addition, columnar conductors 90 may be further loaded around the open stubs 51a and 51b.

Third Embodiment

In a third embodiment, a high frequency filter will be described in which an open stub 111 acting as a resonator and a matching conductor 112 acting as a capacitance matching element are coupled to a first columnar conductor 31 in a third substrate 17.

Figure 13:
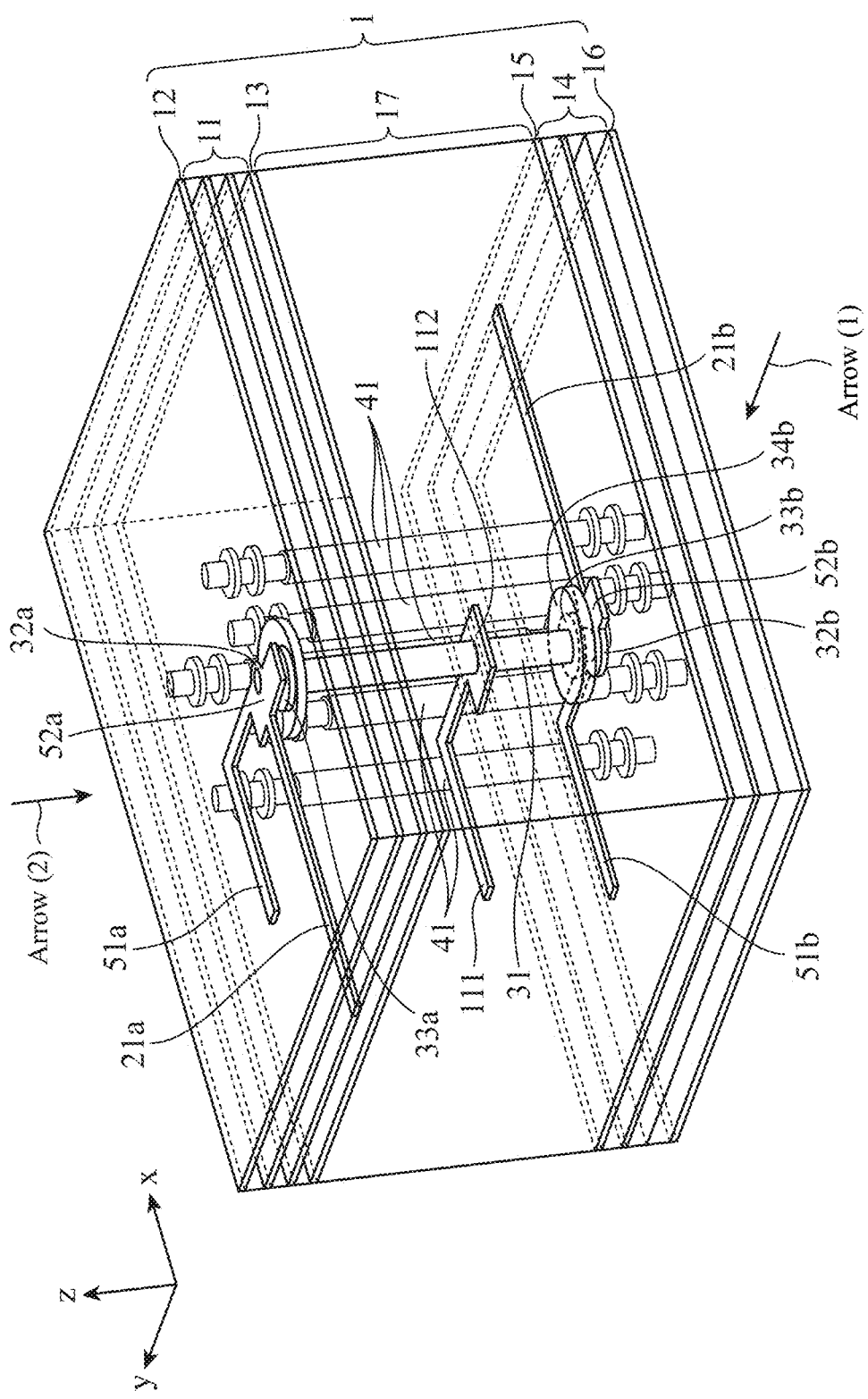
FIG. 13 is a perspective view illustrating a high frequency filter according to a third embodiment.

FIG. 13 is a perspective view illustrating a high frequency filter according to a third embodiment.

Figure 14:
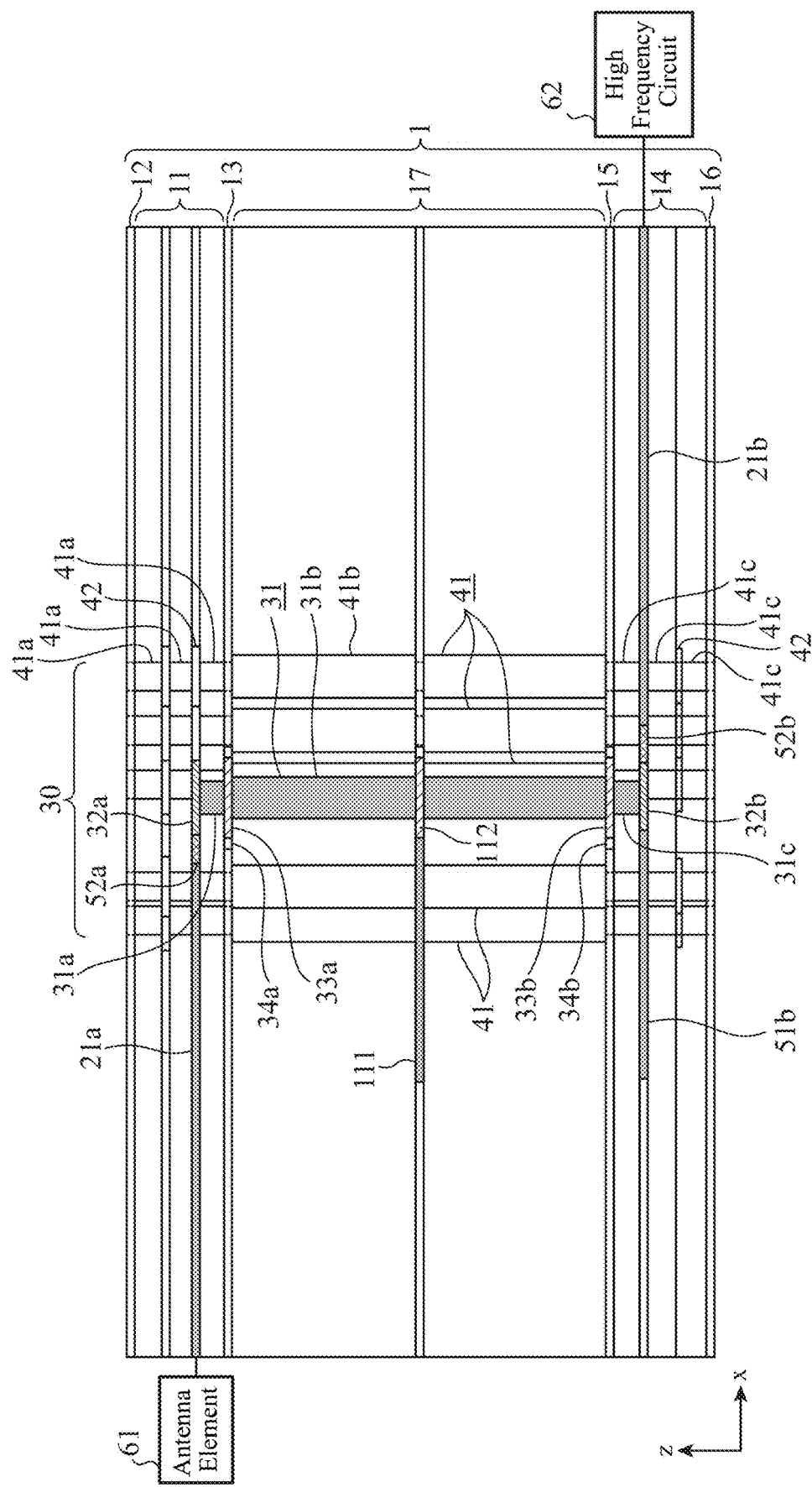
FIG. 14 is a side view of a main part of the high frequency filter of FIG. 13 when viewed from a direction indicated by arrow (1).

FIG. 14 is a side view of a main part of the high frequency filter of FIG. 13 when viewed from a direction indicated by arrow (1).

Figure 15:
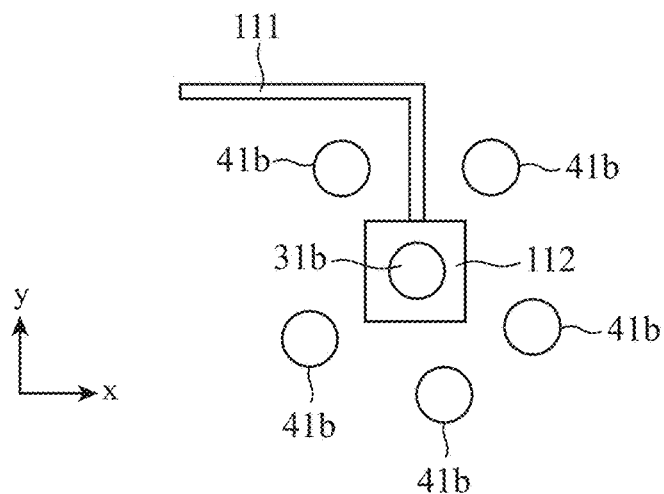
FIG. 15 is a plan view of an open stub 111 and a matching conductor 112 in the high frequency filter of FIG. 13 when viewed from a direction indicated by arrow (2).

FIG. 15 is a plan view of an open stub 111 and a matching conductor 112 in the high frequency filter of FIG. 13 when viewed from a direction indicated by arrow (2).

In FIGS. 13 to 15, the same symbols as those in FIGS. 1 to 3 represent the same or corresponding parts and thus description thereof is omitted.

The open stub 111 is formed inside the third substrate 17 and is electrically coupled to a columnar conductor 31b of the first columnar conductor 31 via the matching conductor 112. The open stub 111 acts as a resonator.

In the high frequency filter illustrated in FIG. 13, the open stub 111 is electrically coupled to the columnar conductor 31b via the matching conductor 112. Note that this is merely an example, and the open stub 111 may be directly coupled to the columnar conductor 31b.

The matching conductor 112 is formed inside the third substrate 17 and is electrically coupled between the columnar conductor 31b and the open stub 111. The matching conductor 112 acts as a capacitance matching element.

The shape of the plane of the matching conductor 112 is square as illustrated in FIG. 15. Note that this is merely an example, and the shape may be a rectangle, for example. The size of the plane of the matching conductor 112 is determined depending on a desired stop band.

Figure 16:
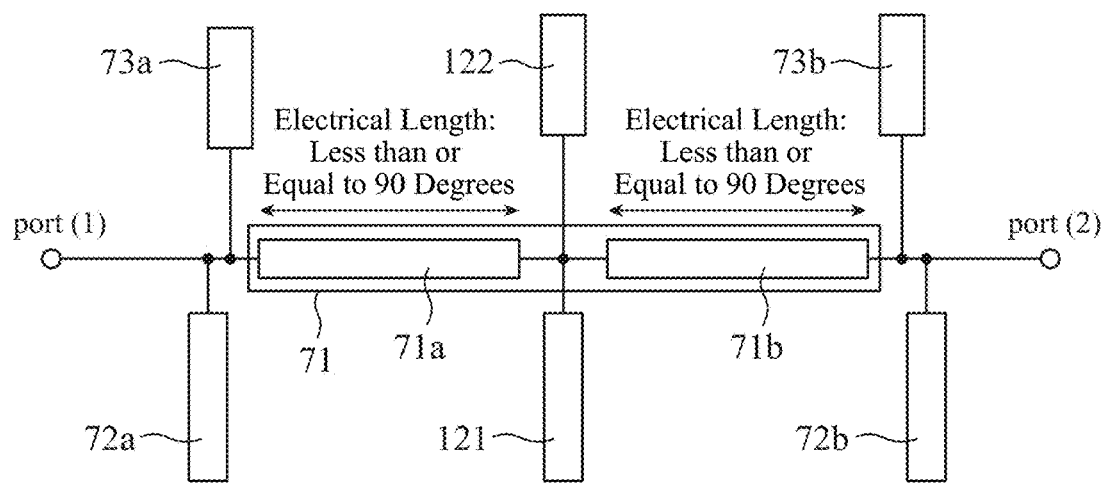
FIG. 16 is an explanatory diagram illustrating an equivalent circuit of the high frequency filter illustrated in FIG. 13.

FIG. 16 is an explanatory diagram illustrating an equivalent circuit of the high frequency filter illustrated in FIG. 13. In FIG. 16, the same symbols as those in FIG. 4 represent the same or corresponding parts and thus description thereof is omitted.

A resonator 121 corresponds to the open stub 111, and is adjusted to have an electrical length of 90 degrees at the center frequency Fc of a stop band.

A capacitance matching element 122 corresponds to the matching conductor 112.

In FIG. 16, a coupled line 71 is depicted as if being divided into a line 71a and a line 71b in order to illustrate that the resonator 121 and the capacitance matching element 122 are coupled midway in the coupled line 71; however, in the actual configuration, the coupled line 71 is a single line.

The electrical length of the line 71a and the electrical length of the line 71b are less than or equal to 90 degrees at the center frequency Fc of the stop band.

The high frequency filter illustrated in FIG. 1 in the first embodiment is a band stop filter for the Ka band.

In the high frequency filter illustrated in FIG. 1, the electrical length of the first columnar conductor 31 (=coupled line 71) corresponding to the vertical feeding portion is less than or equal to 90 degrees at the center frequency Fc of a stop band.

It is also possible in the configuration of the high frequency filter illustrated in FIG. 1 to create a band stop filter for the millimeter-wave band by increasing the electrical length of the first columnar conductor 31.

In a case of creating a band stop filter for the millimeter-wave band in the configuration of the high frequency filter illustrated in FIG. 1, the electric length of the first columnar conductor 31 becomes larger than 90 degrees at the center frequency Fc of a stop band.

In a case where the electrical length of the first columnar conductor 31 is larger than 90 degrees at the center frequency Fc of the stop band, the distance between the open stub 51a and the open stub 51b is an electric length larger than 90 degrees at the center frequency Fc of the stop band.

In the case where the distance between the open stub 51a and the open stub 51b is an electrical length of less than or equal to 90 degrees, a desired stop band can be formed since filtering characteristics of the high frequency filter can be adjusted by changing the electrical lengths of the matching conductors 52a and 52b.

However, in a case where the distance between the open stub 51a and the open stub 51b is an electrical length greater than 90 degrees, it is difficult to form a desired stop band only by changing the electrical lengths of the matching conductors 52a and 52b.

Therefore, in order to form a desired stop band even in the case where the distance between the open stub 51a and the open stub 51b is an electrical length larger than 90 degrees, it is necessary to increase the distance to be an electrical length of 270 degrees.

In a case where the distance between the open stub 51a and the open stub 51b is the electrical length of 270 degrees, a desired stop band can be formed like in the case of the electrical length of 90 degrees.

Since filtering characteristics of the high frequency filter can be adjusted by changing the electrical lengths of the matching conductors 52a and 52b, a desired stop band can be formed even in the case where the distance between the open stub 51a and the open stub 51b is an electrical length of less than or equal to 270 degrees, as long as the electrical length is close to 270 degrees.

As one approach to set the distance between the open stub 51a and the open stub 51b to be an electrical length of less than or equal to 270 degrees at the center frequency Fc of a stop band, a line for compensating the electrical length of the first columnar conductor 31 is added to a vertical feeding portion.

Figure 17:
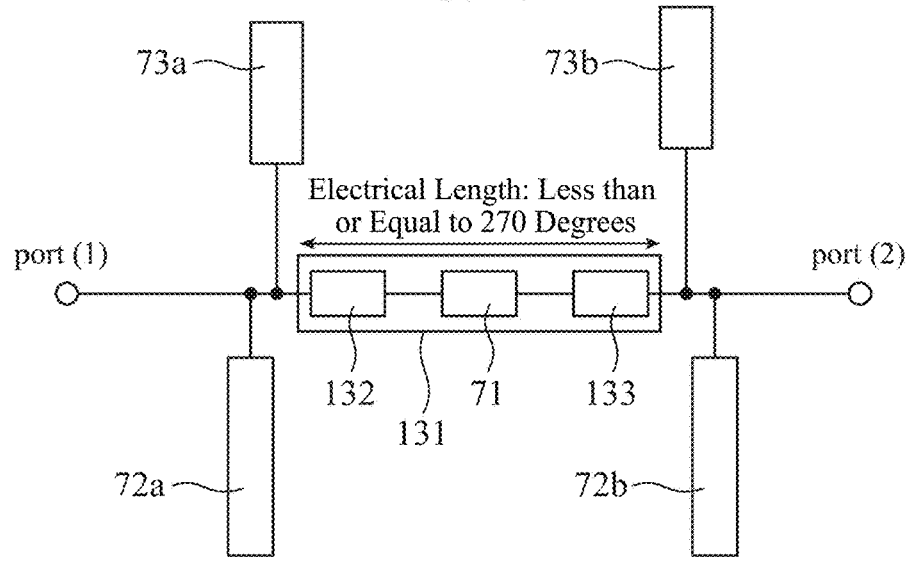
FIG. 17 is an explanatory diagram illustrating an equivalent circuit of a high frequency filter in which a compensation line is added to a first columnar conductor 31.

FIG. 17 is an explanatory diagram illustrating an equivalent circuit of a high frequency filter in which a compensation line is added to the first columnar conductor 31.

In FIG. 17, the same symbols as those in FIG. 4 represent the same or corresponding parts and thus description thereof is omitted.

A coupled line 131 is formed by the first columnar conductor 31 in a coaxial line 30, and the second columnar conductors 41 correspond to ground provided corresponding to the coupled line 131.

The electrical length of the coupled line 131 corresponds to the electrical length of the first columnar conductor 31 and is less than or equal to 270 degrees at the center frequency Fc of a stop band.

A compensation line 132 is coupled to Port (1) at one end thereof and is coupled to one end of a coupled line 71 at the other end thereof.

A compensation line 133 is coupled to the other end of the coupled line 71 at one end thereof and is coupled to Port (2) at the other end thereof.

The coupled line 131 including the coupled line 71 and the compensation lines 132 and 133 corresponds to a vertical feeding portion.

For example, assuming that the physical length of the vertical feeding portion is 2 mm, the electrical length of the vertical feeding portion is 150 degrees. Therefore, for example, to obtain a coupled line 131 having the electrical length of 270 degrees, it is necessary that the physical length of the vertical feeding portion be 3.6 mm.

Since the coupled line 71 having an electrical length of 90 degrees has a physical length of 1.2 mm, the physical length of the compensation lines 132 and 133 is 1.2 mm.

Since the physical length of the coupled line 131 is three times the physical length of the coupled line 71, there are disadvantages that the size of the high frequency filter is increased and that characteristics results in a narrow band.

In the high frequency filter illustrated in FIG. 13 in the third embodiment, the open stub 111 and the matching conductor 112 are coupled to the first columnar conductor 31 in order to obtain characteristics of a band stop filter for the millimeter-wave band without adding compensation lines 132 and 133 to the coupled line 71.

Since the number of stages of resonators becomes larger than that of the high frequency filter illustrated in FIG. 1 by coupling the open stub 111 and the matching conductor 112 to the first columnar conductor 31, it becomes possible to create a high frequency filter that satisfies characteristics of a band stop filter for the millimeter-wave band. The number of stages of resonators in the high frequency filter illustrated in FIG. 1 is two, and the number of stages of resonators in the high frequency filter illustrated in FIG. 13 is three.

The open stub 111 is coupled to the first columnar conductor 31 in such a manner that the distance from the open stub 51a is an electrical length of less than or equal to 90 degrees, and that the distance from the open stub 51b is an electrical length of less than or equal to 90 degrees.

Filtering characteristics of the high frequency filter can be adjusted by changing the electrical lengths of the matching conductors 52a, 52b, 112 acting as capacitance matching elements 73a, 73b, 122. Therefore, a desired stop band can be formed even when each of the distance between the open stub 51a and the open stub 111 and the distance between the open stub 111 and the open stub 51b is an electrical length of less than or equal to 90 degrees at the center frequency Fc of the stop band.

Even in the case where the distance between the open stub 51a and the open stub 111 is an electrical length of 90 degrees and the distance between the open stub 111 and the open stub 51b is an electrical length of 90 degrees, the electric length of the vertical feeding portion is 180 degrees, and the physical length of the vertical feeding portion is 2.4 mm.

Therefore, the size of the vertical feeding portion in which the open stub 111 and the matching conductor 112 are coupled to the first columnar conductor 31 can be reduced as compared to the vertical feeding portion including the coupled line 131, and moreover, a blocked band can be broadened.

FIG. 18 is an explanatory graph illustrating a result of an electromagnetic field analysis of reflection characteristics and passage characteristics in the high frequency filter illustrated in FIG. 13 and a result of an electromagnetic field analysis of reflection characteristics and passage characteristics in the high frequency filter in which the coupled line 131 forms the vertical feeding portion (see FIG. 17).

In FIG. 18, the horizontal axis represents the frequency, and the vertical axis represents the signal level.

It is understood from FIG. 18 that both the high frequency filter illustrated in FIG. 13 and the high frequency filter in which the coupled line 131 forms the vertical feeding portion satisfy the characteristics of a band stop filter for the millimeter-wave band.

It is also understood from FIG. 18 that passage characteristics have a wider band in the high frequency filter illustrated in FIG. 13 as compared with the high frequency filter in which the coupled line 131 forms the vertical feeding portion.

Here, the characteristic impedance of resonators 72a, 72b, and 121 will be described.

For example, let us assume that the distance between the open stub 51a and the open stub 111 is an electrical length of 90 degrees, and the distance between the open stub 111 and the open stub 51b is the electrical length of 90 degrees.

Also assumed is that the resonators 72a, 72b, and 121 have an electrical length of 90 degrees and that the frequency of a signal to be stopped from transmission is 32 GHz.

In this example, characteristic impedance Z of the resonators 72a and 72b is 132.4Ω, and characteristic impedance Z of the resonator 121 is 79Ω as illustrated in FIG. 19.

FIG. 19 is an explanatory diagram illustrating characteristic impedances of resonators 72a, 72b, and 121.

In FIG. 19, the capacitance matching elements 73a, 73b, and 122 are not shown for simplification of description.

In a case where the resonators 72a, 72b, and 121 are formed by, for example, striplines, it is generally known that the maximum value of achievable characteristic impedance Z is about 60Ω. Here, it is assumed that the maximum value of an achievable characteristic impedance Z is 60Ω.

Therefore, each of the resonators 72a, 72b, and 121 cannot be formed by only one stripline.

In a case where it is not possible to form a resonator by only one stripline, a resonator can be formed by serially coupling a line for adjusting the characteristic impedance (hereinafter referred to as "adjustment line") to one stripline for forming a resonator as illustrated in FIGS. 20 and 21.

FIGS. 20 and 21 are explanatory diagrams illustrating a resonator in which a line for adjusting characteristic impedance is coupled to a stripline.

In FIG. 20, an example is illustrated in which a resonator having a characteristic impedance Z of 132.4Ω is formed.

In FIG. 20, electrical characteristics equivalent to those of a resonator having the characteristic impedance Z of 132.4Ω and the electrical length of 90 degrees is obtained by coupling an adjustment line having a characteristic impedance Z of 15Ω and the electric length of 10 degrees to a stripline having a characteristic impedance Z of 60Ω and the electric length of 90 degrees.

In FIG. 21, an example is illustrated in which a resonator having a characteristic impedance Z of 79Ω is formed.

In FIG. 21, electrical characteristics equivalent to those of a resonator having the characteristic impedance Z of 79Ω and the electrical length of 90 degrees is obtained by coupling an adjustment line having a characteristic impedance Z of 17Ω and an electric length of 5 degrees to a stripline having the characteristic impedance Z of 60Ω and the electric length of 90 degrees.

Each of the lines 71a and 71b included in the coupled line 71 illustrated in FIG. 19 can be converted into a π-type circuit as illustrated in FIG. 22.

FIG. 22 is an explanatory diagram illustrating the correspondence between each of the lines 71a and 71b included in the coupled line 71 and the π-type circuit.

In FIG. 22, a line 141 has an electrical length of $\theta_a$ and a characteristic impedance of $Z_a$.

A line 142 is coupled to one end of the line 141 at one end thereof and is coupled to ground at the other end thereof, and has an electrical length of $\theta_b$ and a characteristic impedance of $Z_b$.

A line 143 is coupled to the other end of the line 141 at one end thereof and is coupled to ground at the other end thereof, and has an electrical length of $\theta_b$ and a characteristic impedance of $Z_b$.

Here, it is assumed that the characteristic impedance of each of the lines 71a and 71b is $Z_i$ and that the electrical length of each of the lines 71a and 71b is 90 degrees.

In this case, the characteristic impedance $Z_i$ is expressed as the following equation (2) from the equivalence of an F matrix represented by the following equation (1).

Moreover, the characteristic impedance $Z_b$ is expressed as the following equation (3), where j is an imaginary unit.

$$\begin{bmatrix} 0 & jZ_i \\ \dfrac{j}{Z_i} & 0 \end{bmatrix} = \begin{bmatrix} 1 & 0 \\ j\dfrac{\tan\theta_b}{Z_b} & 1 \end{bmatrix} \begin{bmatrix} \cos\theta_a & jZ_a\sin\theta_a \\ j\dfrac{\sin\theta_b}{Z_a} & \sin\theta_a \end{bmatrix} \begin{bmatrix} 1 & 0 \\ j\dfrac{\tan\theta_b}{Z_b} & 1 \end{bmatrix} \quad (1)$$

$$Z_i = Z_a \times \sin\theta_a \quad (2)$$

$$Z_b = Z_a \times \tan\theta_a \times \tan\theta_b \quad (3)$$

Therefore, each of the lines 71a and 71b included in the coupled line 71 may be formed by a π-type circuit.

In the third embodiment described above, the high frequency filter is configured in such a manner that the open stub 111 acting as the resonator 121 and the matching conductor 112 acting as the capacitance matching element 122 are coupled to the first columnar conductor 31 in the third substrate 17. Therefore, it is possible to obtain a high frequency filter that satisfies the characteristics of a band stop filter for the millimeter-wave band without using the coupled line 131 having the electrical length of 270 degrees.

In addition, the high frequency filter is capable of forming a stop band without disposing a plurality of resonators on the same plane.

In the high frequency filter illustrated in FIG. 13, the single matching conductor 112 is coupled to the first columnar conductor 31.

Figure 23:
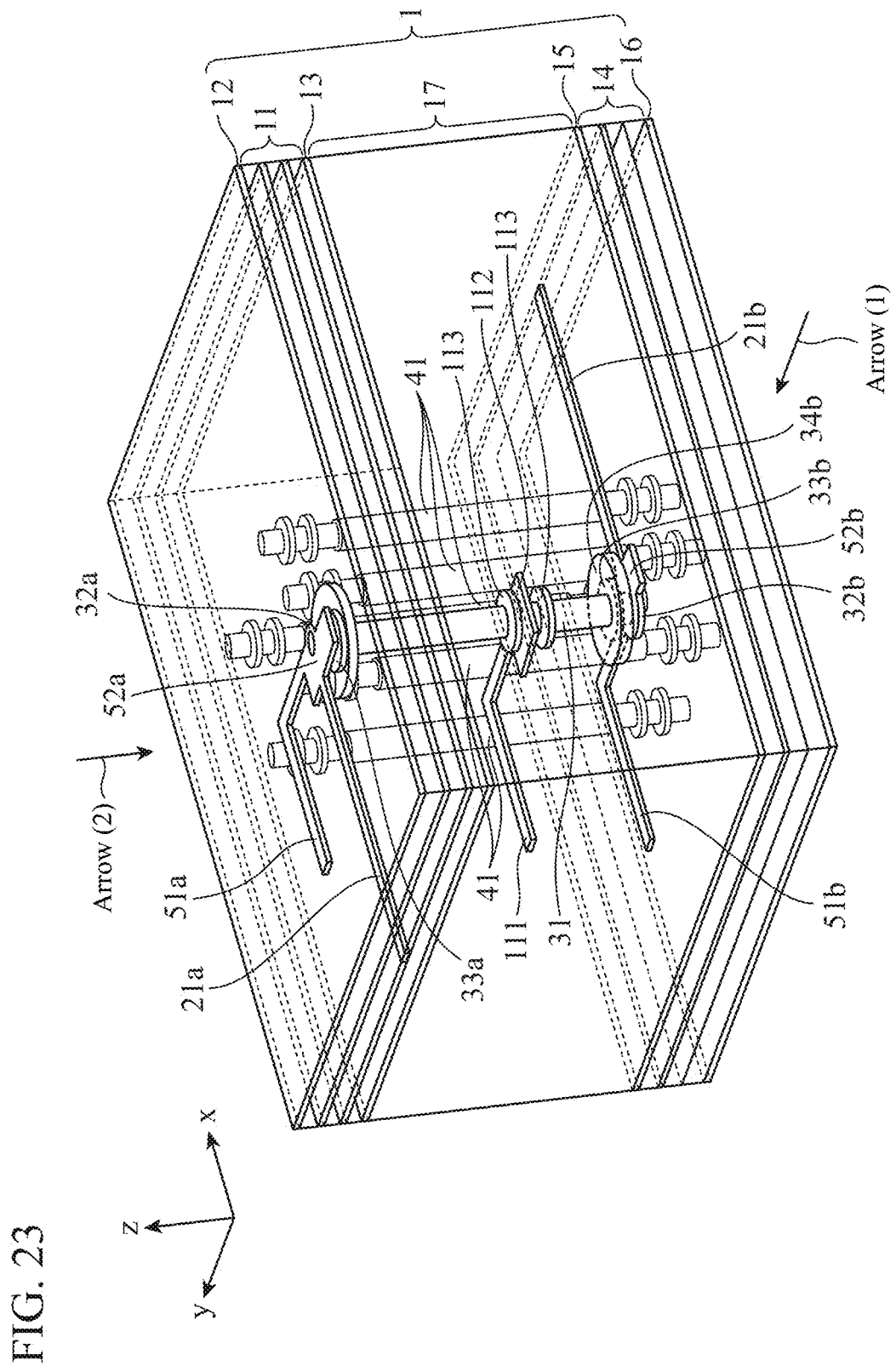
FIG. 23 is a perspective view illustrating another high frequency filter according to the third embodiment.
Figure 24:
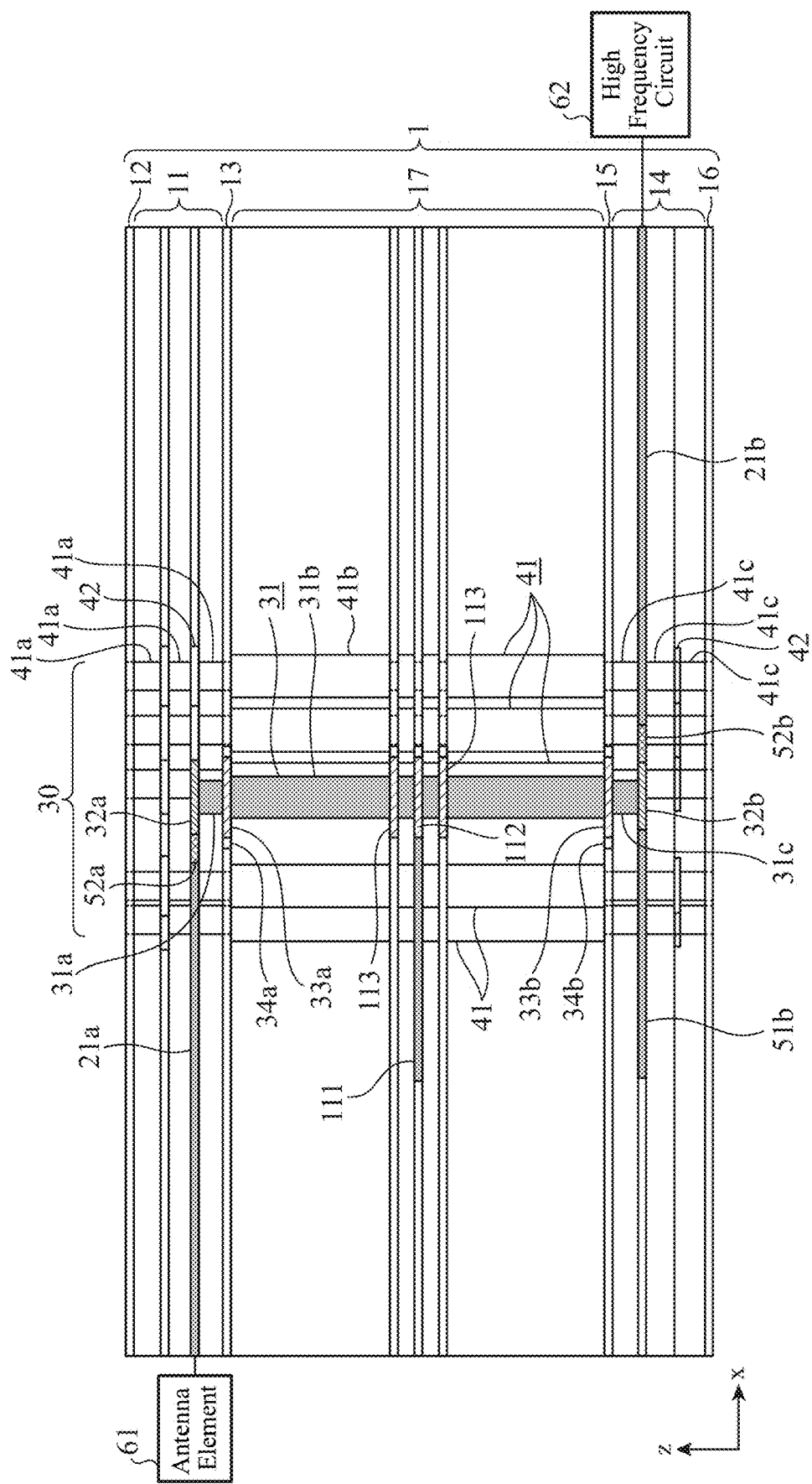
FIG. 24 is a side view of a main part of the high frequency filter of FIG. 23 when viewed from a direction indicated by arrow (1).

Note that this is merely an example, and one or more matching conductors 113 may be coupled to the first columnar conductor 31 in addition to the single matching conductor 112 as illustrated in FIGS. 23 and 24.

FIG. 23 is a perspective view illustrating another high frequency filter according to the third embodiment.

FIG. 24 is a side view of a main part of the high frequency filter of FIG. 23 when viewed from a direction indicated by arrow (1).

In the example of FIGS. 23 and 24, two matching conductors 113 are coupled to a first columnar conductor 31.

Since filtering characteristics of the high frequency filter can be adjusted also by changing the electrical length of the matching conductor 113, by coupling the matching conductor 113 to the first columnar conductor 31, the range in which the filtering characteristics can be adjusted is broadened.

In the high frequency filter according to the third embodiment, the open stubs 51a, 51b, and 111 having an L-shape are illustrated in which the open stubs are bent at one point midway in the line.

Figure 25:
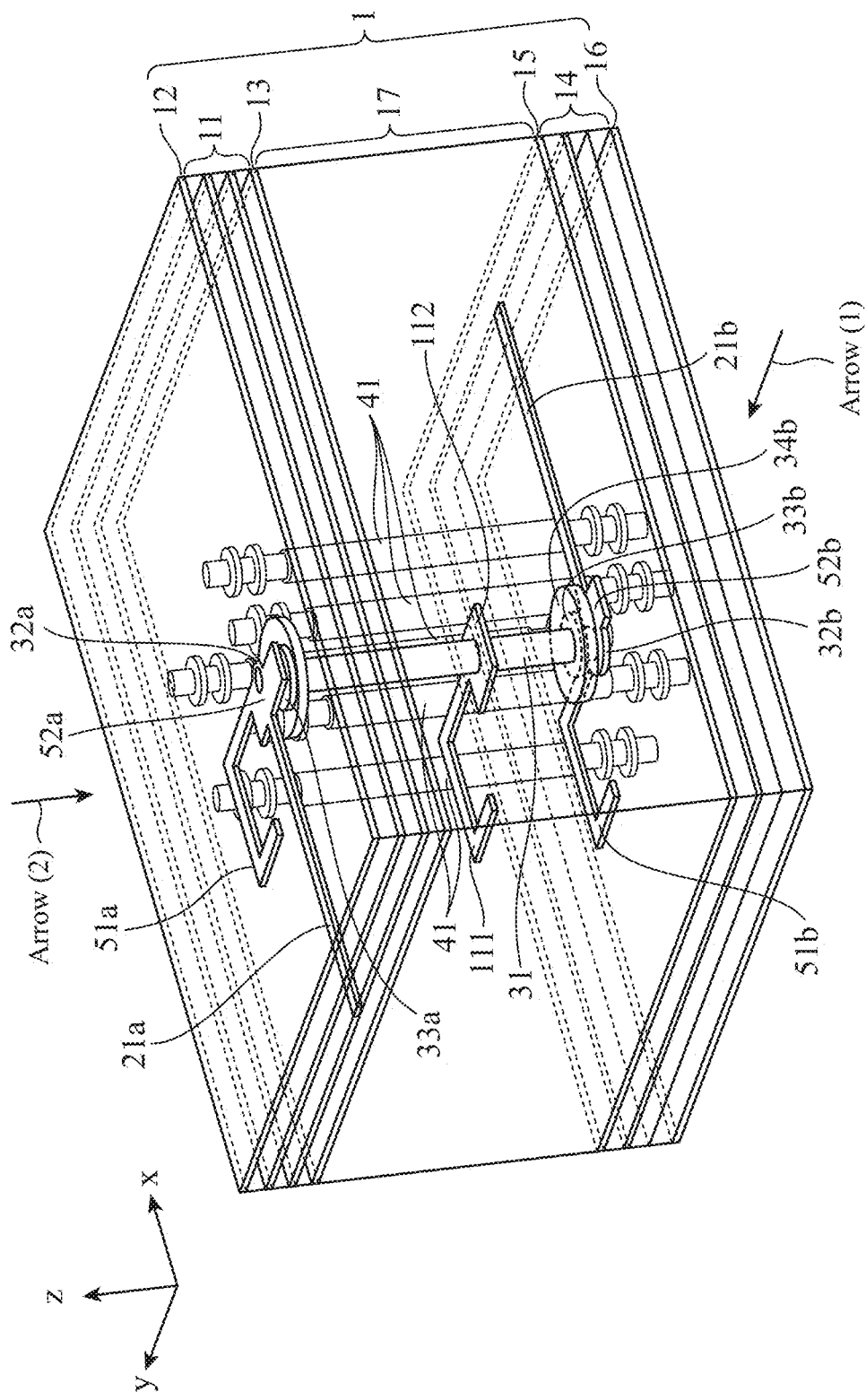
FIG. 25 is a perspective view illustrating still another high frequency filter according to the third embodiment.

Note that this is merely an example, and the open stubs 51a, 51b, and 111 may have any shape and, for example, may be bent at two points midway in the line as illustrated in FIG. 25. Alternatively, the open stubs 51a, 51b, and 111 may have a shape that is bent at three or more points midway in the line, may have a linear shape, or may have a curved shape.

FIG. 25 is a perspective view illustrating still another high frequency filter according to the third embodiment.

Also in the high frequency filter of the third embodiment, columnar conductors 90 may be loaded around the first stripline 21a and the second stripline 21b like in the high frequency filter of the first embodiment. In addition, columnar conductors 90 may be further loaded around the open stubs 51a and 51b.

Fourth Embodiment

In the third embodiment, the high frequency filter in which the single open stub 111 and the single matching conductor 112 are coupled to the first columnar conductor 31 is illustrated.

In a fourth embodiment, a high frequency filter in which a plurality of open stubs 111 and a plurality of matching conductors 112 are coupled to a first columnar conductor 31 will be described.

Figure 26:
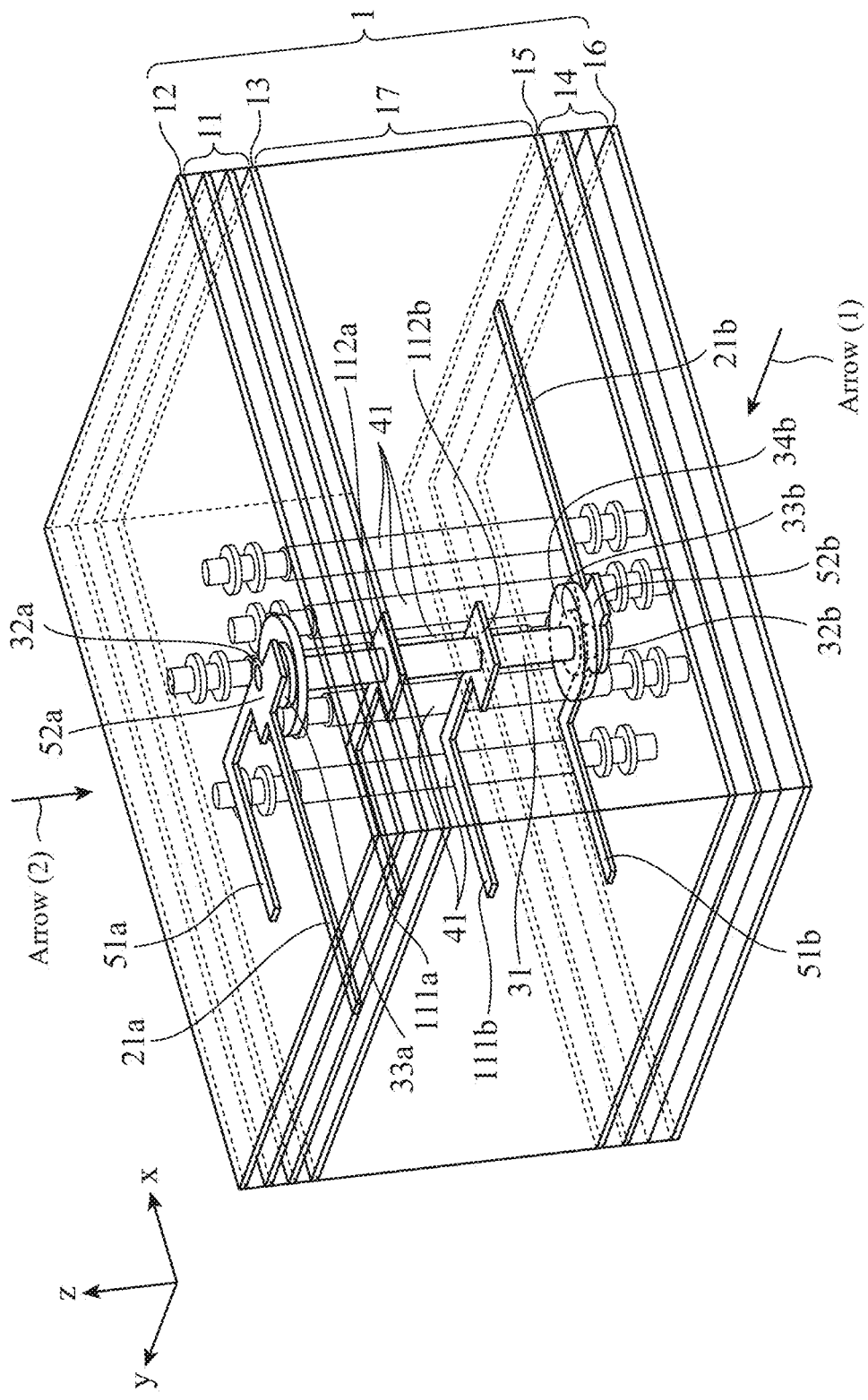
FIG. 26 is a perspective view illustrating a high frequency filter according to a fourth embodiment.

FIG. 26 is a perspective view illustrating a high frequency filter according to the fourth embodiment.

Figure 27:
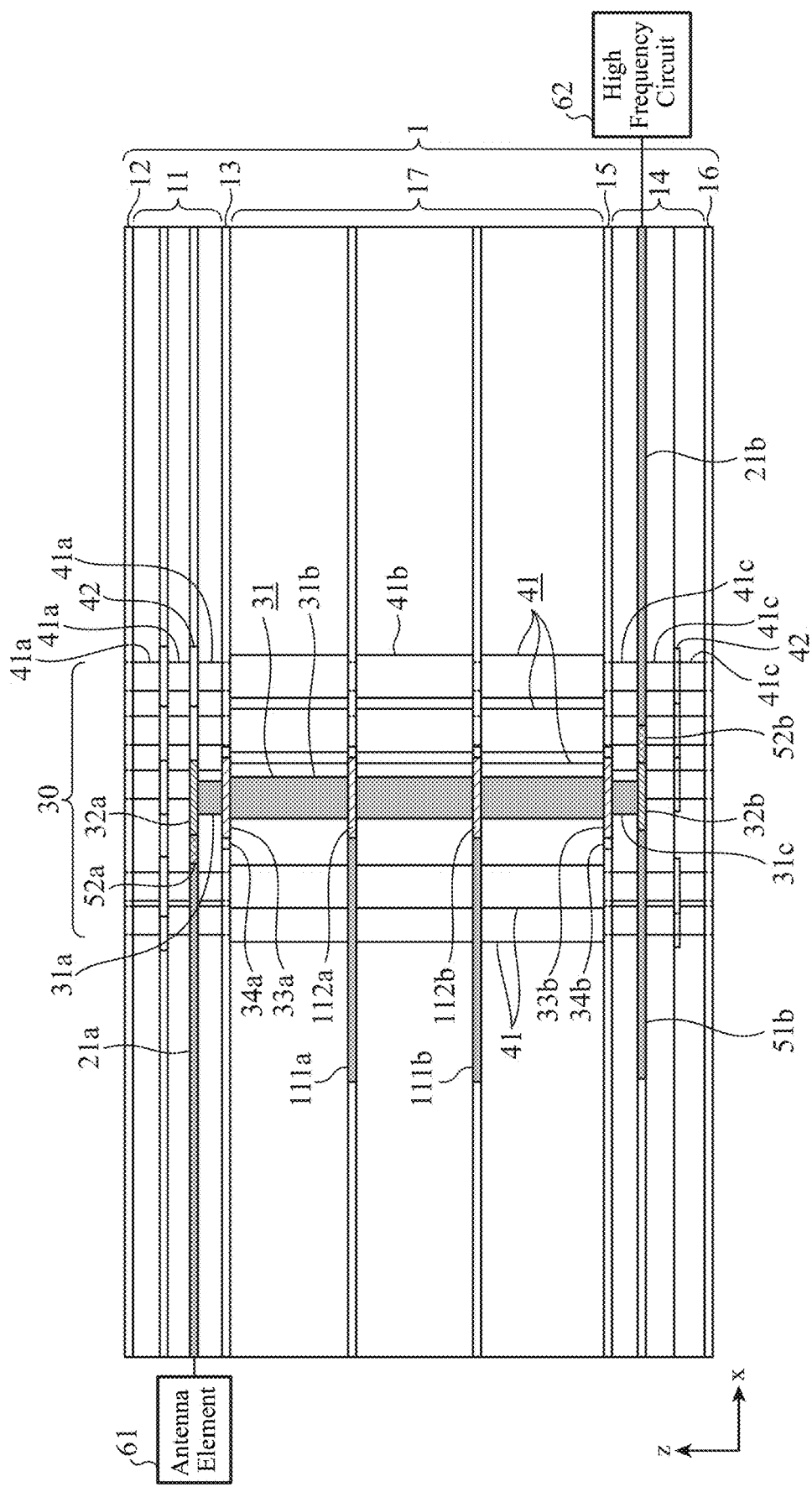
FIG. 27 is a side view of a main part of the high frequency filter of FIG. 26 when viewed from a direction indicated by arrow (1).

FIG. 27 is a side view of a main part of the high frequency filter of FIG. 26 when viewed from a direction indicated by arrow (1).

In FIGS. 26 and 27, the same symbols as those in FIGS. 1, 2, 13, and 14 represent the same or corresponding parts and thus description thereof is omitted.

In the high frequency filter illustrated in FIGS. 26 and 27, two open stubs 111 and two matching conductors 112 are coupled to a first columnar conductor 31.

In FIGS. 26 and 27, in order to distinguish the two open stubs 111, the open stub 111 on the +z side is denoted as an open stub 111a, and the open stub 111 on the −z side is denoted as an open stub 111b.

Also in order to distinguish the two matching conductors 112, the +z side matching conductor 112 is denoted as a matching conductor 112a, and the −z side matching conductor 112 is denoted as a matching conductor 112b.

In the high frequency filter illustrated in FIGS. 26 and 27, two open stubs 111 and two matching conductors 112 are coupled to a first columnar conductor 31. However, it is not limited thereto, and three or more open stubs 111 and three or more matching conductors 112 may be coupled to the first columnar conductor 31 in the high frequency filter.

The distance between the open stub 51a and the open stub 111a is an electrical length of less than or equal to 90 degrees at the center frequency Fc of a stop band.

The distance between the open stub 111a and the open stub 111b is an electrical length of less than or equal to 90 degrees at the center frequency Fc of the stop band.

The distance between the open stub 111b and the open stub 51b is an electrical length of less than or equal to 90 degrees at the center frequency Fc of the stop band.

In a case where three or more open stubs 111 and three or more matching conductors 112 are coupled to the first columnar conductor 31, an interval of the three or more open stubs 111 is an electrical length of less than or equal to 90 degrees at the center frequency Fc of the stop band.

By coupling the open stubs 111a and 111b and the matching conductors 112a and 112b to the first columnar conductor 31, the number of stages of resonators becomes larger than that of the high frequency filters illustrated in FIGS. 1 and 13. As a result, it becomes easier to create a high frequency filter that satisfies characteristics of a band stop filter for the millimeter-wave band. The number of stages of resonators in the high frequency filter illustrated in FIG. 1 is two, the number of stages of resonators in the high frequency filter illustrated in FIG. 13 is three, and the number of stages of resonators in the high frequency filter illustrated in FIG. 26 is four.

Also in the high frequency filter of the fourth embodiment, columnar conductors 90 may be loaded around the first stripline 21a and the second stripline 21b like in the high frequency filter of the first embodiment. In addition, columnar conductors 90 may be further loaded around the open stubs 51a and 51b.

Fifth Embodiment

The high frequency filters of the first to fourth embodiments include a coaxial line in which a plurality of second columnar conductors 41 is disposed so as to surround the first columnar conductor 31.

In a fifth embodiment, a high frequency filter will be described in which a first columnar conductor 31 and second columnar conductors 41 are disposed concentrically in such a manner that the plurality of second columnar conductors 41 surrounds the first columnar conductor 31.

Figure 28:
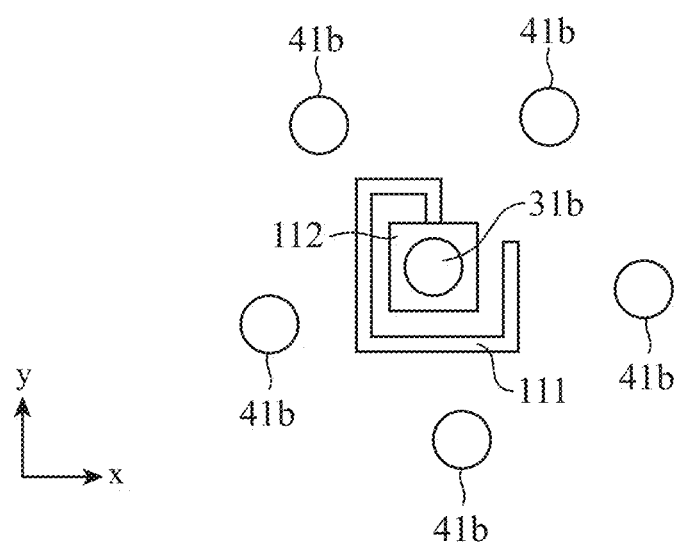
FIG. 28 is an explanatory diagram illustrating an example of an open stub 111 disposed between a first columnar conductor 31 and second columnar conductors 41.

In the high frequency filter according to the fifth embodiment, an open stub 111 is disposed between a columnar conductor 31b of the first columnar conductor 31 and columnar conductors 41b of the second columnar conductors 41 as illustrated in FIG. 28.

FIG. 28 is an explanatory diagram illustrating an example of the open stub 111 disposed between the first columnar conductor 31 and the second columnar conductor 41.

The open stub 111 illustrated in FIG. 28 has a loop shape.

The high frequency filter in which the loop-shaped open stub 111 is disposed between the first columnar conductor 31 and the second columnar conductors 41 can be miniaturized as compared to, for example, a high frequency filter in which a linear open stub is coupled.

Also in the high frequency filter of the fifth embodiment, columnar conductors 90 may be loaded around the first stripline 21a and the second stripline 21b like in the high frequency filter of the first embodiment. In addition, columnar conductors 90 may be further loaded around the open stubs 51a and 51b.

Note that the present invention may include a flexible combination of the respective embodiments, a modification of any component of the respective embodiments, or an omission of any component in the respective embodiments within the scope of the present invention.

INDUSTRIAL APPLICABILITY

The present invention is suitable for a high frequency filter including open stubs acting as resonators and matching conductors acting as capacitance matching elements.

REFERENCE SIGNS LIST

1: Multilayer substrate, 11: First substrate, 12, 13: Ground layer, 14: Second substrate, 15, 16: Ground layer, 17: Third substrate, 21a: First stripline, 21b: Second stripline, 30: Coaxial line, 31: First columnar conductor, 31a, 31b, 31c: Columnar conductor, 32a, 32b, 33a, 33b: Coupling member, 34a, 34b: Hole, 41: Second columnar conductor, 41a, 41b, 41c: Columnar conductor, 42: Land, 51a, 51b: Open stub, 52a, 52b: Matching conductor, 61: Antenna element, 62: High frequency circuit, 71: Coupled line, 71a: Line, 71b: Line, 72a, 72b: Resonator, 73a, 73b: Capacitance matching element, 81: Coupled line, 82a, 82b: Resonator, 90: Columnar conductor, 101: Antenna element, 102: Parasitic element, 103: BGA, 104: Wiring, 111, 111a, 111b: Open stub, 112, 112a, 112b, 113: Matching conductor, 121: Resonator, 122: Capacitance matching element, 131: Coupled line, 132, 133: Compensation line.

The invention claimed is:

1. A high frequency filter, comprising:
a multilayer substrate including: a first substrate in which a first stripline is wired in an inner layer of the first substrate; a second substrate in which a second stripline is wired in an inner layer of the second substrate; and a third substrate inserted between the first substrate and the second substrate; and
a coaxial line including:
a first columnar conductor disposed inside the multilayer substrate such that one end of the first columnar conductor is coupled to the first stripline and that another end of the first columnar conductor is coupled to the second stripline; and
one or more second columnar conductors penetrating the multilayer substrate such that one end of each of the one or more second columnar conductors is coupled to a ground layer formed on, of two surfaces of the first substrate, a surface opposite to a surface on which the third substrate is disposed and that another end of each of the one or more second columnar conductors is coupled to a ground layer formed on, of two surfaces of the second substrate, a plane opposite to a surface on which the third substrate is disposed, the first columnar conductor acting as an inner conductor, and the second columnar conductors acting as outer conductors, wherein
each of the first and second striplines is coupled to a respective open stub acting as a resonator and a respective matching conductor acting as a capacitance matching element, and
in the third substrate, the first columnar conductor is coupled to one or more open stubs acting as resonators and is coupled to one or more matching conductors acting as capacitance matching elements.

2. The high frequency filter according to claim 1, wherein a number of the one or more open stubs coupled to the first columnar conductor is one, and
each of a distance between the open stub coupled to the first stripline and the open stub coupled to the first columnar conductor and a distance between the open stub coupled to the second stripline and the open stub coupled to the first columnar conductor is an electrical length of less than or equal to 90 degrees at a center frequency of a stop band which is a frequency band in which transmission of a signal is stopped.

3. The high frequency filter according to claim 1, wherein the one or more open stubs coupled to the first columnar conductor include a plurality of open stubs, and
each of a distance between, out of the plurality of open stubs coupled to the first columnar conductor, an open stub disposed on a side of the open stub coupled to the first stripline and the open stub coupled to the first stripline, a distance between, out of the plurality of open stubs coupled to the first columnar conductor, an open stub disposed on a side of the open stub coupled to the second stripline and the open stub coupled to the second stripline, and an interval of the plurality of open stubs coupled to the first columnar conductor is an electrical length of less than or equal to 90 degrees at a center frequency of a stop band which is a frequency band in which transmission of a signal is stopped.

4. The high frequency filter according to claim 1, wherein the first columnar conductor and the second columnar conductors are disposed concentrically such that the second columnar conductors surround the first columnar conductor, and
the open stub coupled to the first columnar conductor is disposed between the first columnar conductor and the second columnar conductors.

* * * * *